US011522009B2

(12) United States Patent
Gallagher et al.

(10) Patent No.: US 11,522,009 B2
(45) Date of Patent: Dec. 6, 2022

(54) MRAM DEVICE HAVING SELF-ALIGNED SHUNTING LAYER

(71) Applicant: Taiwan Semiconductor Manufacturing Co., Ltd., Hsin-Chu (TW)

(72) Inventors: William J. Gallagher, Hsinchu (TW); Shy-Jay Lin, Jhudong Township (TW); Ming Yuan Song, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 433 days.

(21) Appl. No.: 16/724,710

(22) Filed: Dec. 23, 2019

(65) Prior Publication Data

US 2021/0036054 A1 Feb. 4, 2021

Related U.S. Application Data

(60) Provisional application No. 62/880,192, filed on Jul. 30, 2019.

(51) Int. Cl.
| | | |
|---|---|---|
| *H01L 21/00* | (2006.01) | |
| *H01L 21/02* | (2006.01) | |
| *H01L 27/22* | (2006.01) | |
| *H01L 43/14* | (2006.01) | |
| *H01L 43/04* | (2006.01) | |

(52) U.S. Cl.
CPC .......... *H01L 27/228* (2013.01); *H01L 43/04* (2013.01); *H01L 43/14* (2013.01)

(58) Field of Classification Search
CPC .......... H01L 43/04–14; H01L 27/228
USPC .......... 257/295; 438/3, 785
See application file for complete search history.

(56) References Cited

U.S. PATENT DOCUMENTS

| | | | | |
|---|---|---|---|---|
| 10,008,248 | B2 * | 6/2018 | Buhrman | G11C 11/1673 |
| 10,516,098 | B2 * | 12/2019 | Sayed | H01L 43/10 |
| 10,622,048 | B2 * | 4/2020 | Shiokawa | G11C 11/1693 |
| 10,636,962 | B2 * | 4/2020 | Park | H01L 43/02 |
| 10,720,570 | B2 * | 7/2020 | Le | H01F 10/329 |

OTHER PUBLICATIONS

Robertson, Neil. "New Approaches to MRAM Switching." Western Digital Corporation, published in 2017.

(Continued)

*Primary Examiner* — Calvin Lee
(74) *Attorney, Agent, or Firm* — Eschweiler & Potashnik, LLC

(57) ABSTRACT

Various embodiments of the present disclosure are directed towards a memory device including a shunting layer overlying a spin orbit torque (SOT) layer. A magnetic tunnel junction (MTJ) structure overlies a semiconductor substrate. The MTJ structure includes a free layer, a reference layer, and a tunnel barrier layer disposed between the free and reference layers. A bottom electrode via (BEVA) underlies the MTJ structure, where the BEVA is laterally offset from the MTJ structure by a lateral distance. The SOT layer is disposed vertically between the BEVA and the MTJ structure, where the SOT layer continuously extends along the lateral distance. The shunting layer extends across an upper surface of the SOT layer and extends across at least a portion of the lateral distance.

20 Claims, 21 Drawing Sheets

(56) References Cited

OTHER PUBLICATIONS

Fukami et al. "A Spin-Orbit Torque Switching Scheme With Collinear Magnetic Easy Axis and Current Configuration." Nature Nanotechnology, vol. 11, Jul. 2016, published Mar. 21, 2016.
Shi et al. "Fast, Low-Current Spin-Orbit Torque Switching of Magnetic Tunnel Junctions Through Atomic Modifications of the Free Layer Interfaces." Phys. Rev. Applied 9, 011002, published Jan. 30, 2018.
Shi et al. "Fast Low-Current Spin-Orbit-Torque Switching of Magnetic Tunnel Junctions Through Atomic Modifications of the Free-Layer Interfaces." Physical Review Applied 9, 011002 (2018), published Jan. 30, 2018.
Shi et al. "Fast, Reliable Spin-Orbit-Torque Switching in Three Terminal Magnetic Tunnel Junctions With HF Dusting Layer." Proc. of SPIE vol. 10732 107321U-1, published Sep. 20, 2018.
Yoda et al. "Voltage-Control Spintronics Memory (VoCSM) Having Potentials of Ultra-Low Energy-Consumption and High-Density." 2016 IEEE International Electron Devices Meeting (IEDM), published on Feb. 2, 2017.

\* cited by examiner

MRAM DEVICE HAVING SELF-ALIGNED SHUNTING LAYER

REFERENCE TO RELATED APPLICATION

This application claims the benefit of U.S. Provisional Application No. 62/880,192, filed on Jul. 30, 2019, the contents of which are hereby incorporated by reference in their entirety.

BACKGROUND

This disclosure relates in general to volatile and nonvolatile memory for use in stand-alone memory chips and for memory arrays integrated on to logic chips. More particularly, this disclosure relates to magnetic memory devices for integrated circuits that store information according to the direction of magnetic moments in magnetic film layers within magnetic tunnel junction (MTJ) devices. Such memory is most commonly referred to as magnetoresistive random access memory or MRAM.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
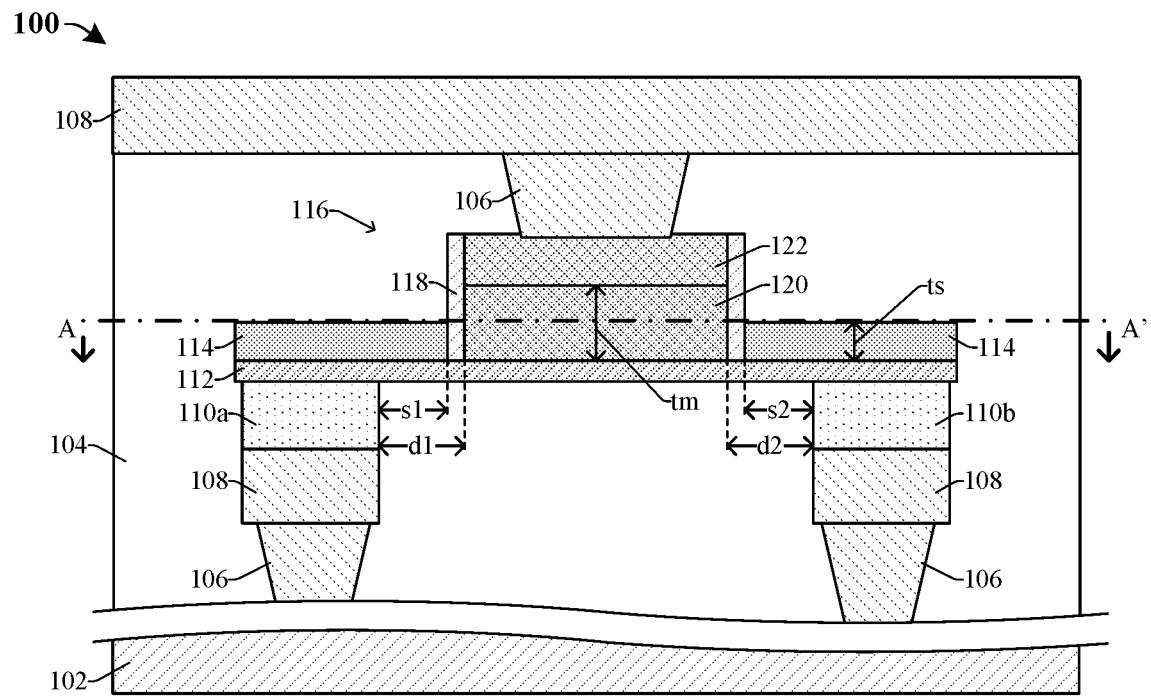
FIG. 1A illustrates a cross-sectional view of some embodiments of a memory device including a magnetic tunnel junction (MTJ) structure overlying a spin orbit torque (SOT) layer and a shunting layer disposed along an upper surface of the SOT layer.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A magnetic tunnel junction (MTJ) includes first and second ferromagnetic films separated by a thin non-magnetic barrier layer, typically a quantum mechanical tunnel barrier layer (referred to as a "tunnel barrier layer"). One of the ferromagnetic films (often referred to as a "reference layer") has a fixed magnetization direction, while the other ferromagnetic film (often referred to as a "free layer") has a variable magnetization direction, most stably pointing in one of two opposite directions. If the magnetization directions of the reference layer and free layer are in a parallel (P) orientation, electrons will relatively more easily tunnel through the tunnel barrier layer, meaning that the MTJ is in a low-resistance state. Conversely, if the magnetization directions of the reference layer and free layer are in an antiparallel (AP) orientation, electrons will have more difficulty tunneling through the tunnel barrier layer, meaning that the MTJ is in a high-resistance state. The MTJ can be switched between two states of electrical resistance by reversing the magnetization direction of the free layer.

One common mechanism by which the state of the free layer can be switched includes spin-transfer torque (STT), in which electrons tunnel through the tunnel barrier layer, as in so called "STT-MRAM." In a STT-MRAM device the read current and write current are both applied across the MTJ. This can result in a number of challenges, including a reduction of endurance and/or an increase of power consumption of the STT-MRAM device due to write currents traveling through the MTJ. Another mechanism that can be utilized to switch the state of the free layer includes spin orbit torque (SOT), in which an in-plane current is applied across an adjacent SOT layer, as in so called "SOT-MRAM." This in turn facilitates switching the state of the free layer without applying a current across the MTJ, thereby increasing endurance and decreasing power consumption of the SOT-MRAM device. An SOT-MRAM device includes one or more bottom electrode vias (BEVAs) overlying a lower metal wire in an interconnect structure. The MTJ is disposed beneath a top electrode via (TEVA) that contacts an overlying upper metal wire in the interconnect structure. The MTJ is laterally offset from the BEVA (or BEVAs) by a non-zero distance. An SOT layer extends from an upper surface of the BEVA, laterally across the non-zero distance, and contacts a bottom surface of the MTJ, thereby electrically coupling the MTJ to the BEVA. A write voltage may be applied to the SOT layer to switch a state of the free layer disposed in the MTJ. The write current driven by the write voltage travels across the non-zero distance between the MTJ and the BEVA(s).

A challenge with the above SOT-MRAM device includes a voltage drop of the write voltage while traveling across the non-zero distance between the MTJ and the BEVA. In some embodiments, to compensate for the voltage drop across the non-zero distance, the write voltage may be increased by a factor of at least two. This in turn leads to increased power consumption and increased heating of the SOT-MRAM device. Further, in order to handle the increased write voltage, the size of semiconductor devices (e.g., transistors) configured to apply the write voltage may be increased. This in turn may increase costs associated with fabricating the SOT-MRAM device while decreasing the number of SOT-MRAM devices that may be disposed over a single substrate.

The present disclosure, in some embodiments, relates to a memory device that decreases the voltage drop across the non-zero distance between the MTJ and the BEVA, thereby decreasing the write voltage of the MRAM device. For example, the MRAM device includes the BEVA overlying a lower conductive wire in an interconnect structure. An MTJ is disposed under a top electrode via (TEVA) that contacts an upper conductive wire in the interconnect structure, where the BEVA is laterally offset from the MTJ by a non-zero distance. A sidewall spacer structure laterally surrounds an outer perimeter of the MTJ. An SOT layer laterally extends across the non-zero distance to electrically couple the BEVA to the MTJ, where the SOT layer is disposed vertically between a lower surface of the MTJ and an upper surface of the BEVA. Further, a shunting layer overlies the SOT layer and laterally extends across an upper surface of the SOT layer. The shunting layer overlies the BEVA and is laterally separated from the MTJ by the sidewall spacer structure. The shunting layer comprises a conductive material with high conductivity configured to mitigate the voltage drop of the write current across the non-zero distance between the BEVA and the MTJ. This in turn decreases the write voltage of the MRAM device, thereby decreasing power consumption of the MRAM device.

FIG. 1A illustrates a cross-sectional view of some embodiments of a memory device 100 including a magnetic tunnel junction (MTJ) structure 120 overlying a spin orbit torque (SOT) layer 112 and a shunting layer 114 disposed along an upper surface of the SOT layer 112.

The memory device 100 includes a memory cell 116 disposed within an interconnect dielectric structure 104. The interconnect dielectric structure 104 overlies a substrate 102.

The memory cell 116 includes the MTJ structure 120 and a capping structure 122 over the MTJ structure 120. The MTJ structure 120 is disposed between a conductive via 106 and the SOT layer 112. In some embodiments, the MTJ structure 120 includes a pinned layer, a free layer, and a tunnel barrier layer disposed between the free and pinned layers. The memory cell 116 is configured to store a data state based upon a resistive value of the memory cell 116. For example, the memory cell 116 will either store a first data state (e.g., a logical "0") if the memory cell 116 has a low resistance state or a second data state (e.g., a logical "1") if the memory cell 116 has a high resistance state. In some embodiments, during operation, the MTJ structure 120 can be changed between the low resistance state and the high resistance state through the injection of a spins from the SOT layer 112. In some embodiments, the memory cell 116 is configured as a SOT magnetoresistive random-access memory (MRAM) (SOT-MRAM) cell.

A conductive via 106 is disposed within the interconnect dielectric structure 104 and is disposed beneath a conductive wire 108. A first bottom electrode via (BEVA) 110a is disposed within the interconnect dielectric structure 104 and underlies a first side of the SOT layer 112. A second BEVA 110b is disposed within the interconnect dielectric structure 104 and underlies a second side of the SOT layer 112, where the first side is opposite the second side. Thus, the memory cell 116 is spaced laterally between the first and second BEVAs 110a, 110b by distances d1, d2 respectively. In some embodiments, the distances d1, d2 are each non-zero. The shunting layer 114 overlies the SOT layer 112 and may laterally wrap around the memory cell 116. A sidewall spacer structure 118 is disposed along sidewall(s) of the memory cell 116 and is configured to laterally separate the shunting layer 114 from the MTJ structure 120. In some embodiments, the sidewall spacer structure 118 is configured to prevent the shunting layer 114 from electrically shorting layers of the MTJ structure 120 to one another.

In some embodiments, during operation of the memory device 100, a write signal (e.g., a current and/or a voltage) is applied across the SOT layer 112. The write signal may travel from the first BEVA 110a to the second BEVA 110b, or vice versa. Because the first and second BEVAs 110a, 110b are respectively laterally separated from the memory cell 116 by the distances d1, d2, a drop in voltage of the write signal may occur as the write signal travels across the distance d1 and/or the distance d2. Thus, in some embodiments, in order to mitigate the drop in voltage of the write signal, the shunting layer 114 directly contacts portions of the upper surface of the SOT layer 112 and comprises a conductive material with high conductivity. In some embodiments, the highly conductive material of the shunting layer 114 coupled with a thickness of the shunting layer 114 decreases the drop in voltage because current may more easily flow through a conductor (e.g., the shunting layer 114) with higher conductivity and/or a greater cross-sectional area. This in turn decreases a magnitude of the signal required for writing (e.g., reduces the write voltage) and decreases a buildup of heat in the memory cell 116, thereby decreasing a power consumption and increasing endurance of the memory device 100.

In some embodiments, the MTJ structure 120 has a thickness tm within a range of about 10 to 30 nanometers. In further embodiments, a thickness of the capping structure 122 may, for example, be within a range of about 20 to 40 nanometers. In some embodiments, the shunting layer 114 may, for example, be or comprise copper, gold, silver, a combination of the foregoing, or the like and/or may have a thickness ts within a range of about 2 nanometers to half or more of the thickness tm of the MTJ 120 plus the thickness of the capping structure 122, a range of about 2 to 35 nanometers, or another suitable thickness. In some embodiments, if the thickness ts is less than about 2 nanometers, then the shunting layer 114 may be unable to properly reduce the voltage drop of the write signal to nearly just the voltage drop across the SOT layer under the sidewall spacer regions 118 (i.e., the voltage drop across distances d1-s1 and d2-s2) thereby decreasing the performance of the memory device 100. In further embodiments, if the thickness ts is greater than 35 nanometers and/or greater than approximately half of the total thickness tm of the MTJ 120 plus the thickness of the capping structure 122, then the shunting layer 114 may occasionally electrically short layers of the MTJ structure 120 and/or the capping structure 122 to one another, thereby rendering the memory cell 116 inoperable.

In some embodiments, a thickness of the SOT layer 112 and the resistivity of the SOT layer 112 are configured such that when a write current passes along the SOT layer 112 it may generate spin accumulations via the spin Hall effect near the top and bottom of the SOT layer 112, including a spin accumulation into the free layer of the MTJ structure 120 sufficient to drive a change of the resistance value of the MTJ structure 120. In such embodiments, the generated spin accumulation may set the resistance value of the MTJ structure 120 by providing torques to the free layer magnetization. Thus, a sheet resistance (e.g., resistivity/thickness) of the SOT layer 112 is configured to lower the required write voltage at a given write pulse length to set the resistance value of the MTJ structure 120. In some embodiments, when the shunting layer 114 is omitted (not shown), there is an increased voltage drop along what is now the un-shunted SOT layer 112, which increases the voltage demand for cell operation and increases the cell power dissipation. However, in some embodiments according to the present disclosure, because the shunting layer 114 overlies the SOT layer 112, the shunting layer 114 may assist in carrying current from the first and/or second BEVA 110a-b across the distances s1, s2 to the SOT layer 112 underlying the MTJ structure 120. This reduces the voltage drop across the total distances d1, d2 and facilities the SOT layer 112 to generate with less total voltage drop the proper spin accumulation to cause the free layer of the MTJ structure 120 to switch its magnetization direction. In some embodiments, a sheet resistance (e.g., resistivity/thickness) of the shunting layer 114 is within a range of about 5 to 90 percent of the sheet resistance of the SOT layer 112. As the sheet resistance of the shunting layer 114 decreases, the loss of power across the shunted regions (distances s1, s2) also decreases. This in part is because of an ability of the shunting layer 114 to assist in carrying current with less resistance to the SOT layer 112 in regions under the sidewall insulators 118 and under the MTJ structure 120. For example, in some embodiments, if the sheet resistance of the shunting layer 114 is half (i.e., 50 percent) of the sheet resistance of the SOT layer 112, then a loss of power across the distances s1, s2 may be reduced by about a factor of three (roughly, neglecting current crowding near the ends of shunt layers 114 overlying the SOT layer 112). In another example, if the sheet resistance of the shunting layer is a fourth (i.e., 25 percent) of the sheet resistance of the SOT layer 112, then a loss of power across the distances s1, s2 may be reduced by a factor of five (again, neglecting the current crowding effect). Thus, in some embodiments, a conductivity of the shunting layer 114 is greater than a conductivity of the SOT layer 112.

Figure 1B:
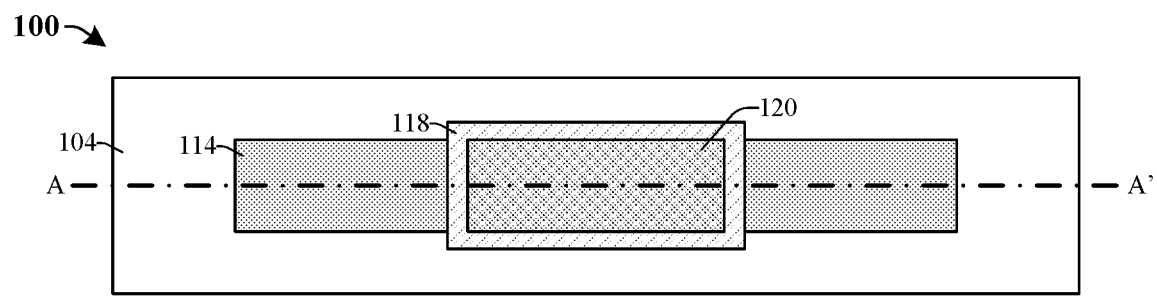
FIGS. 1B-C illustrate top views according to some alternative embodiments of the memory device of FIG. 1A taken along the line A-A'.

FIG. 1B illustrates a top view of some embodiments of the memory device 100 of FIG. 1A taken along line A-A', in which the sidewall spacer structure 118 laterally encloses the MTJ structure 120, thereby laterally separating the MTJ structure 120 from the shunting layer 114. The MTJ structure 120 and/or the sidewall spacer structure 118 may, for example, each have a rectangular shape when viewed from above.

Figure 1C:
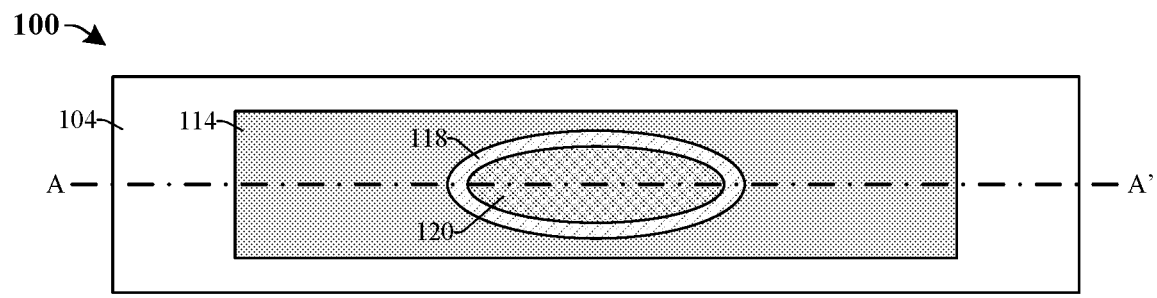

FIG. 1C illustrates a top view of some alternative embodiments of the memory device 100 of FIG. 1A taken along line A-A', in which the sidewall spacer structure 118 and the shunting layer 114 each laterally enclose the MTJ structure 120. The MTJ structure 120 and/or the sidewall spacer structure 118 may, for example, each have a circular shape, an elliptical shape, or another suitable shape when viewed from above. In some embodiments, the structure in FIG. 1C has some portion of shunting layer 114 that facilitates a fraction of the write current being shunted to the side of the MTJ structure 120 and the sidewall spacer structure 118. In such embodiments, this portion of current that does not flow under the MTJ structure 120 may not perform a beneficial function for writing and is to be minimized by making the shunt paths of the shunting layer 114 around the sides of the MTJ structure 120 as narrow as possible, or, for example, by eliminating the side conducting path completely.

Figure 2:
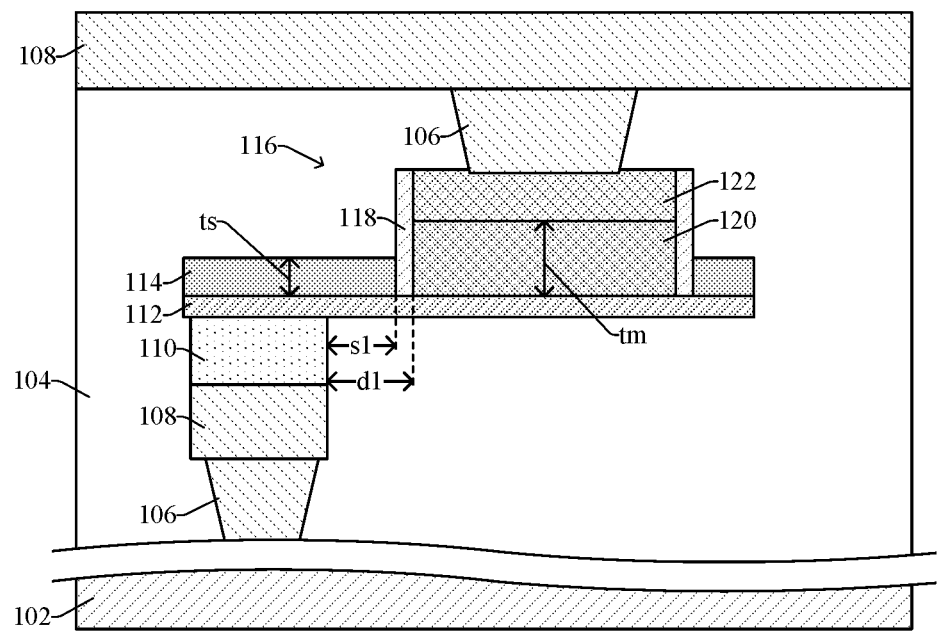
FIG. 2 illustrates a cross-sectional view of some embodiments of a memory device including a two-terminal SOT magnetoresistive random-access memory (MRAM) (SOT-MRAM) cell overlying a SOT layer and a shunting layer laterally enclosing the SOT-MRAM cell.

FIG. 2 illustrates a cross-sectional view of some embodiments of a memory cell 200 according to some alternative embodiments of the memory device 100 of FIGS. 1A-C.

In some embodiments, the memory cell 116 may be configured as a two-terminal SOT-MRAM cell, in which a bottom electrode via (BEVA) 110 underlies the memory cell 116. In further embodiments, the BEVA 110 may be the only underlying conductive structure directly electrically coupled to the SOT layer 112. In yet further embodiments, the shunting layer 114 is configured to minimize the drop in voltage of a write signal applied across the SOT layer 112 as the write signal traverses the distance s1.

Figure 3A:
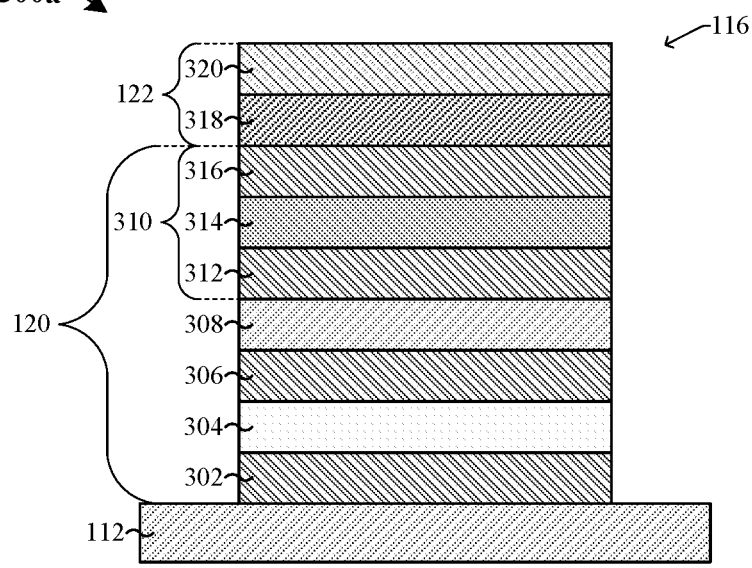
FIGS. 3A-C illustrate cross-sectional views of some embodiments of an MTJ structure having multiple layers and overlying an SOT layer.

FIG. 3A illustrates a cross-sectional view of some embodiments of a memory cell 116 having an MTJ structure 120 with a plurality of memory layers. The MTJ structure 120 and the capping structure 122 of FIG. 3A include a detailed breakout of some embodiments of the layers comprised respectively in the MTJ structure 120 and capping structure 122 of FIGS. 1A-C and/or 2.

A free layer 302 overlies the SOT layer 112. In some embodiments, the free layer 302 directly contacts the SOT layer 112. A pinned reference layer 306 overlies the free layer 302 and a tunnel barrier layer 304 is sandwiched between the pinned reference layer 306 and the free layer 302. A spacer layer 308 overlies the pinned reference layer 306 and separates the pinned reference layer 306 from a synthetic anti-ferromagnetic (SAF) structure 310. In some embodiments, the SAF structure 310 includes a lower pinned ferromagnetic layer 312, an upper pinned ferromagnetic layer 316, and an exchange coupling metal layer 314 sandwiched between the lower and upper pinned ferromagnetic layers 312, 316. In further embodiments, the capping structure 122 includes a first capping layer 318 and a second capping layer 320 overlying the first capping layer 318.

In some embodiments, the pinned reference layer 306 has a fixed or a "pinned" magnetic orientation that points in a first direction. The free layer 302 can have a variable or "free" magnetic orientation, which can be switched between two or more distinct magnetic polarities that each represents a different data state, such as a different binary state. In some embodiments, if the magnetization directions of the pinned reference layer 306 and the free layer 302 are in a parallel relative orientation, it is more likely that charge carriers (e.g., electrons) will tunnel through the tunnel barrier layer 304, such that the MTJ structure 120 is in a low-resistance state. Conversely, in some embodiments, if the magnetization directions of the pinned reference layer 306 and the free layer 302 are in an anti-parallel orientation, it is less likely that charge carriers (e.g., electrons) will tunnel through the tunnel barrier layer 304, such that the MTJ structure 120 is in a high-resistance state. Under normal operating conditions, the MTJ structure 120 may switch between the low-resistance state and the high-resistance state based upon a write signal (e.g., a current and/or a voltage) applied (laterally) across the SOT layer 112.

In some embodiments, the SOT layer 112 may, for example, be or comprise platinum, palladium, beta-phase tungsten, beta phase tantalum, $Pt_{0.85}Hf_{0.15}$, $Bi_2Se_3$, an alloy of the foregoing, such as an alloy of palladium and platinum (e.g., $Pd_{0.25}Pt_{0.75}$) or an alloy of gold and platinum (e.g., $Au_{0.25}Pt_{0.75}$), or the like and/or may have a thickness within a range of about 2 to 8 nanometers. In some embodiments, the free layer 302 may, for example, be or comprise iron, cobalt, nickel, an alloy of the foregoing, cobalt iron boron, or the like and/or have a thickness within a range of about 1 to 1.3 nanometers or about 1.3 to 2 nanometers. In some embodiments, the thickness of the free layer 302 may depend on whether a perpendicular or an in-plane preferred direction for the stable magnetic states is desired. In some embodiments, the tunnel barrier layer 304 may, for example, be or comprise magnesium oxide (MgO), aluminum oxide (e.g., $Al_2O_3$), nickel oxide, or the like and/or have a thickness within a range of about 1 to 2 nanometers. In some embodiments, the pinned reference layer 306 may, for example, be or comprise iron, cobalt, nickel, an alloy of the foregoing, cobalt, iron boron, or the like and/or have a thickness within a range of about 1 to 1.3 nanometers or about 1.3 to 2 nanometers. In some embodiments, the thickness of the pinned reference layer 306 may depend on whether a perpendicular or an in-plane preferred direction for the stable magnetic states is desired. In further embodiments, the free layer 302, the tunnel barrier layer 304, and/or the pinned reference layer 306 may each have a body-centered-cubic (bcc) structure with (100) orientation. In some embodiments, the spacer layer 308 may, for example, be or comprise tungsten, molybdenum, tantalum, a combination of the foregoing, or the like and/or have a thickness within a range of about 0.3 to 1 nanometers.

In some embodiments, the lower pinned ferromagnetic layer 312 may, for example, be or comprise cobalt, nickel, iron, an alloy of the foregoing, cobalt iron boron, or the like and/or may have a thickness within a range of about 1 to 3 nanometers. In further embodiments, the exchange coupling metal layer 314 may, for example be or comprise ruthenium, iridium, a combination of the foregoing, or the like and/or may have a thickness within a range of about 0.4 to 1 nanometers. In some embodiments, the upper pinned ferromagnetic layer 316 may, for example, be or comprise cobalt, nickel, iron, an alloy of the foregoing, cobalt iron boron, or the like and/or may have a thickness within a range of about 1 to 3 nanometers. In some embodiments, the SAF structure 310 may have a face-center-cubic (fcc) structure with (111) orientation. In some embodiments, the first capping layer 318 may, for example, be or comprise ruthenium and/or may have a thickness of about 2 nanometers. In some embodiments, the second capping layer 320 may, for example, be or comprise tantalum, tantalum nitride, or tungsten, and/or may have a thickness of about 2 nanometers. In some embodiments, the capping structure 122 may have thicker layers and may be configured as a hard mask structure that protects layers within the MTJ structure 120 from damage during processing steps (e.g., patterning process(es)) utilized to form the memory cell 116.

Figure 3B:
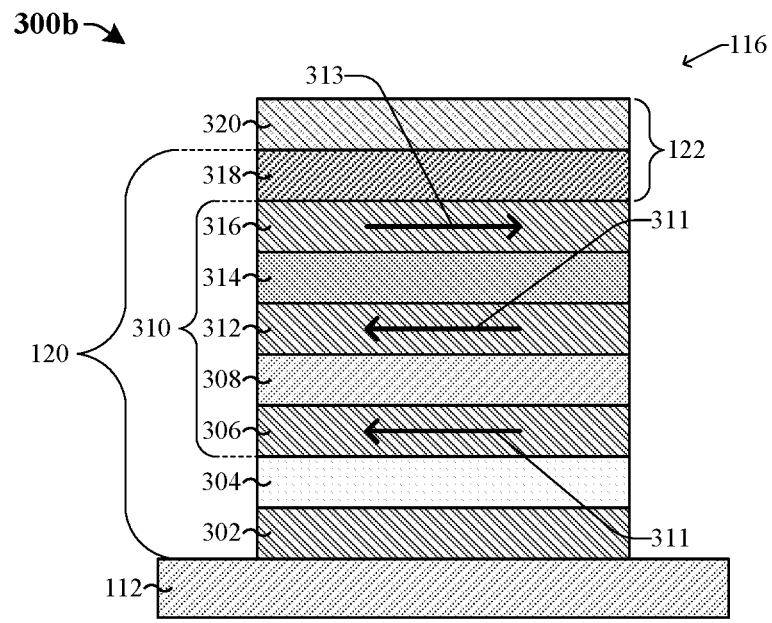

FIG. 3B illustrates a cross-sectional view of some embodiments of a memory cell 116 having an MTJ structure 120 with a plurality of memory layers. The MTJ structure 120 and the capping structure 122 of FIG. 3B include a detailed breakout of some embodiments of the layers comprised respectively in the MTJ structure 120 and capping structure 122 of FIGS. 1A-C and/or 2.

In some embodiments, the free layer 302 overlies the SOT layer 112 and may, for example, be or comprise cobalt, iron, boron, another suitable material, or a combination of the foregoing and/or may have a thickness within a range of about 1.2 to 1.5 nanometers or within a range of about 1 to 1.3 nanometers. In further embodiments, the tunnel barrier layer 304 overlies the free layer 302 and may, for example, be or comprise magnesium oxide and/or may have a thickness within a range of about 1 to 2 nanometers. In yet further embodiments, the pinned reference layer 306 may, for example, be or comprise cobalt, iron, boron, another suitable material, or a combination of the foregoing and/or may have a thickness within a range of about 1.1 to 1.4 nanometers. In various embodiments, the free layer 302, the tunnel barrier layer 304, and/or the pinned reference layer 306 may respectively have a body-centered-cubic (bcc) structure with (100) orientation. Further, the pinned reference layer 306 may have a fixed magnetic orientation pointing in a first direction 311.

In some embodiments, the spacer layer 308 overlies the pinned reference layer 306 and may, for example, be or comprise tungsten, molybdenum, a combination of the foregoing, or the like and/or may have a thickness within a range of about 0.2 to 0.5 nanometers. The spacer layer 308 may, for example, be configured as a texture-breaking layer. In some embodiments, the lower pinned ferromagnetic layer 312 overlies the spacer layer 308 and may, for example, be or comprise cobalt, iron, boron, a combination of the foregoing, or the like and/or may have a thickness within a range of about 1.1 to 2 nanometers. In yet further embodiments, the lower pinned ferromagnetic layer 312 may have a fixed magnetic orientation pointing in the first direction 311. In some embodiments, the exchange coupling metal layer 314 overlies the lower pinned ferromagnetic layer 312 and may, for example, be or comprise ruthenium, iridium, or the like and/or may have a thickness within a range of about 0.3 to 0.9 nanometers. In further embodiments, the upper pinned ferromagnetic layer 316 may, for example, be or comprise cobalt, iron, boron, a combination of the foregoing, or the like and/or may have a thickness within a range of about 2 to 3.5 nanometers. In various embodiments, the upper pinner ferromagnetic layer 316 may have a fixed magnetic orientation pointing in a second direction 313 opposite the first direction 311. In further embodiments, the first capping layer 318 may, for example, be or comprise platinum, manganese, a combination of the foregoing, or the like and/or may have a thickness of about 20 nanometers or about 2 nanometers. In yet further embodiments, the second capping layer 320 may, for example, be or comprise tantalum, tungsten, or the like and/or may have a thickness of about 40 nanometers. In various embodiments, the lower pinned ferromagnetic layer 312, the upper pinned ferromagnetic layer 316, the first capping layer 318, and/or the second capping layer 320 may respectively have a face-center-cubic (fcc) structure with (111) orientation.

Figure 3C:
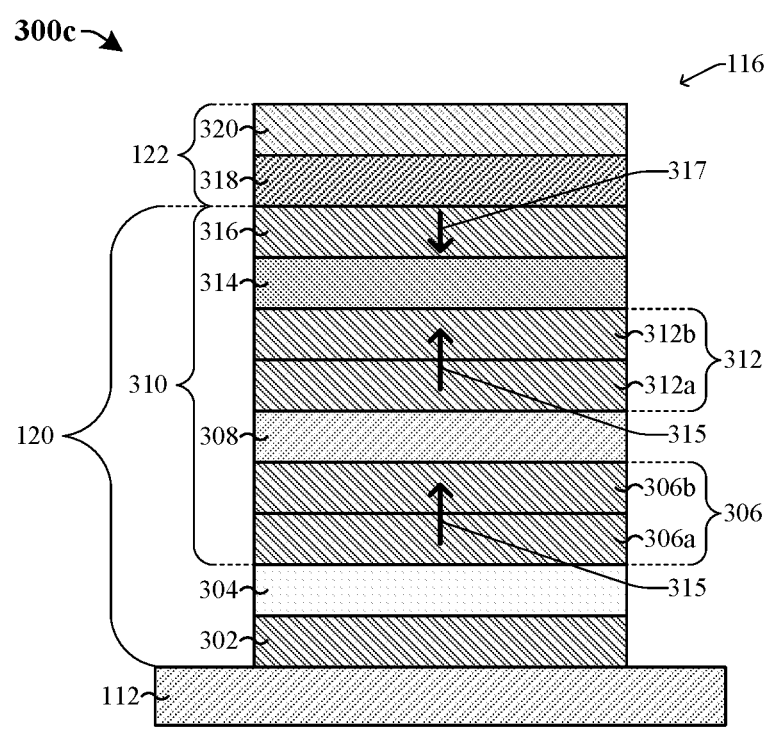

FIG. 3C illustrates a cross-sectional view of some embodiments of a memory cell 116 having an MTJ structure 120 with a plurality of memory layers according to some alternative embodiments of the memory cell 116 of FIG. 3B.

In some embodiments, the pinned reference layer 306 may include a first pinned reference layer 306a and a second pinned reference layer 306b. In further embodiments, the first pinned reference layer 306a may, for example, be or comprise iron and/or may have a thickness of about 0.5 nanometers. In yet further embodiments, the second pinned reference layer 306b may, for example, be or comprise cobalt, iron, boron, a combination of the foregoing, or the like and/or may have a thickness of about 0.8 nanometers. The pinned reference layer 306 may have a fixed magnetic orientation pointing in a first direction 315.

In various embodiments, the lower pinned ferromagnetic layer 312 may comprise one or more layers, for example, a first lower pinned ferromagnetic stack 312a and a second lower pinned ferromagnetic layer 312b. In some embodiments, the first lower pinned ferromagnetic stack 312a may comprise multiple layers (e.g., ten layers) that are arranged as an alternating stack of a first layer and a second layer (not shown). In further embodiments, the first layer may, for example, be or comprise cobalt with a thickness of about 0.25 nanometers and the second layer may, for example, be or comprise platinum with a thickness of about 0.8 nanometers. In yet further embodiments, the second lower pinned ferromagnetic layer 312b may, for example, be or comprise cobalt with a thickness of about 0.3 nanometers. The lower pinned ferromagnetic layer 312 may have a fixed magnetic orientation pointing in the first direction 315.

In yet further embodiments, the upper pinned ferromagnetic layer 316 may comprise an alternating stack of a first layer and a second layer (e.g., sixteen layers) (not shown). In some embodiments, the first layer may, for example, be or comprise cobalt and may have a thickness of about 0.25 and the second layer may, for example, be or comprise platinum with a thickness of about 0.8 nanometers. The upper pinned ferromagnetic layer 316 may have a fixed magnetic orientation pointing in a second direction 317 that is opposite to the first direction 315.

Figure 4:
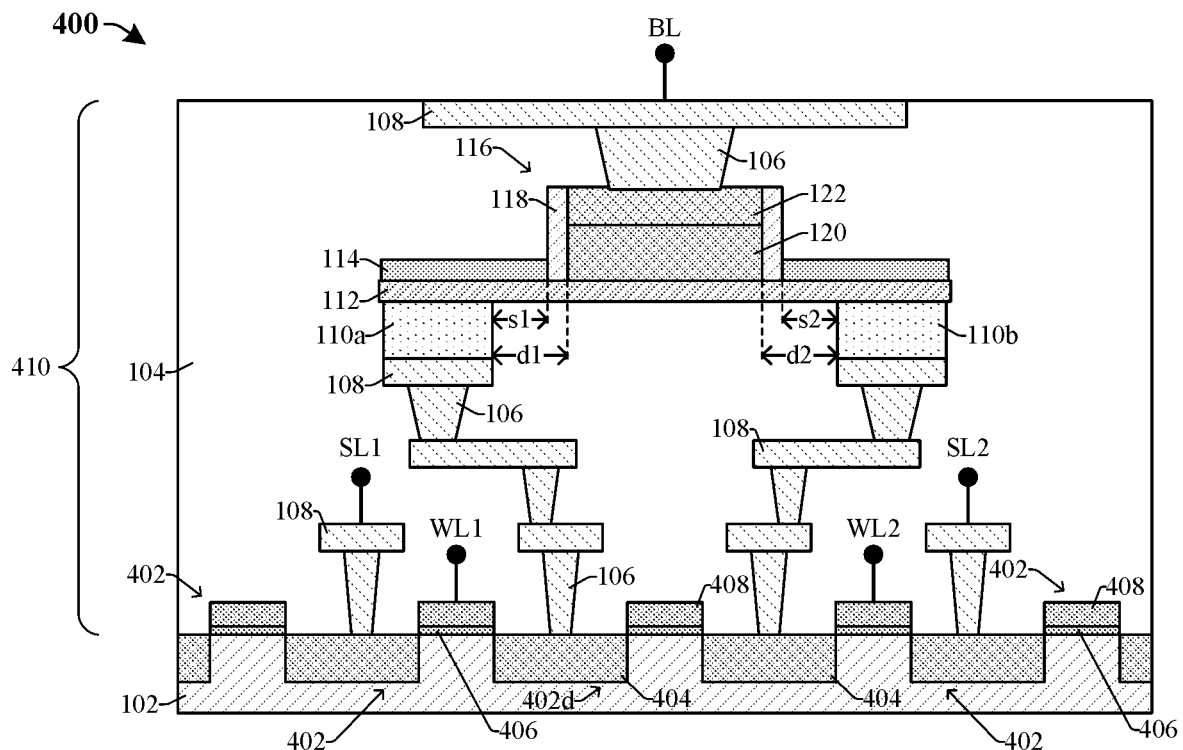
FIG. 4 illustrates a cross-sectional view of some embodiments of an integrated circuit (IC) including a shunting layer laterally enclosing a three-terminal SOT-MRAM cell disposed within an interconnect structure.

FIG. 4 illustrates a cross-sectional view of some embodiments of an integrated circuit (IC) 400 including a shunting layer 114 disposed on opposite sides of a memory cell 116 disposed within an interconnect structure 410.

In some embodiments, the IC 400 includes the interconnect structure 410 overlying the substrate 102, where the memory cell 116 is embedded within the interconnect structure 410. In some embodiments, the substrate 102 may, for example, be a bulk substrate (e.g., a bulk silicon substrate) or a silicon-on-insulator (SOI) substrate, or another suitable substrate. Semiconductor devices 402 are disposed over and/or within the substrate 102. In some embodiments, the semiconductor devices 402 are configured as transistors that each include source/drain regions 404, a gate dielectric layer 406, and a gate electrode 408. In some embodiments, the gate electrode 408 may, for example, be or comprise doped polysilicon or a metal, such as aluminum, copper, a combination of the foregoing, or the like. In some embodiments, the gate dielectric layer 406 may, for example, be or comprise an oxide, such as silicon dioxide, a high-k dielectric material, or the like. In some embodiments, the substrate 102 may comprise a first doping type (e.g., p-type) and the source/drain regions 404 may comprise a second doping type (e.g., n-type) opposite the first doping type.

The interconnect structure 410 includes an interconnect dielectric structure 104, a plurality of conductive vias 106 and a plurality of conductive wires 108. In some embodiments, the conductive vias and wires 106, 108 may, for example, each be or comprise aluminum, copper, tungsten, titanium, a combination of the foregoing, or the like. In further embodiments, the interconnect dielectric structure 104 may comprise a plurality of dielectric layers, such as inter-level dielectric (ILD) layers (e.g., comprising an oxide, a low-k dielectric material, or the like) and/or dielectric protection layers (e.g., comprising silicon carbide, silicon nitride, or the like). In some embodiments, a first conductive wire in the plurality of conductive wires 108 is electrically coupled to a first source line (SL1) and a second conductive wire in the plurality of conductive wires 108 is electrically coupled to a second source line (SL2). Further, a gate electrode 408 of a first semiconductor device in the semiconductor devices 402 is electrically coupled to a first word line (WL1) and a gate electrode 408 of a second semiconductor device in the semiconductor devices 402 is electrically coupled to a second word line (WL2). An upper conductive wire in the plurality of conductive wires 108 is electrically coupled to a bit line (BL). The interconnect structure 410 is configured to electrically couple one or more of the semiconductor devices 402 to the memory cell 116 (e.g., by way of the conductive vias and wires 106, 108).

The memory cell 116 is disposed within the interconnect dielectric structure 104. A first BEVA 110a underlies the memory cell 116 and is laterally offset the memory cell 116 by a distance d1 in a first direction. A second BEVA 110b underlies the memory cell 116 and is laterally offset from the memory cell 116 by a distance d2 in a second direction opposite the first direction. An SOT layer 112 continuously laterally extends from the first BEVA 110a to the second BEVA 110b. In some embodiments, a lower surface of the SOT layer 112 directly contacts an upper surface of the first BEVA 110a and directly contacts an upper surface of the second BEVA 110b. In further embodiments, an upper surface of the SOT layer 112 directly contacts an MTJ structure 120 of the memory cell 116. A sidewall spacer structure 118 laterally wraps around sidewalls of the memory cell 116. In some embodiments, a bottom surface of the sidewall spacer structure 118 directly contacts the upper surface of the SOT layer 112. In further embodiments, a shunting layer 114 continuously extends along the upper surface of the SOT layer 112, where the shunting layer 114 does not extend along an upper surface of the SOT layer 112 in which the sidewall spacer structure 118 and/or MTJ structure 120 overlies the SOT layer 112.

In some embodiments, the IC 400 comprises and/or is electrically coupled to support circuitry that is configured to read and/or write to the memory cell 116. In some embodiments, the support circuitry may include a BL decoder circuit (not shown), a controller circuit (not shown) (e.g. a microprocessor circuit), a word line (WL) decoder (not shown), the semiconductor devices 402, and/or other semiconductor devices (not shown) (e.g., diodes, other transistors, a combination of the foregoing, or the like). In some embodiments, the first BEVA 110a is configured as a first terminal, the second BEVA 110b is configured as a second terminal, and the conductive via 106 overlying the memory cell 116 is configured as a third terminal. In such embodiments, the memory cell 116 of FIG. 4 is configured as a three-terminal SOT-MRAM cell. In some embodiments, during operation of the IC 400, a write signal (e.g., a current and/or a voltage) is applied between the first BEVA 110a and the second BEVA 110b, such that the write signal travels across the SOT layer 112. In some embodiments, a direction of the write signal may be determined by potentials of the WL1, SL1, WL2, and/or SL2 (i.e., the path of the write signal is bidirectional). An electrical pulse along the path of the write signal affects the magnetization direction of the free layer disposed within the MTJ structure 120 of the memory cell 116. In some embodiments, because the distances s1, s2 between the bottom vias 106 and the sidewall spacer 118 are each non-zero, a significant drop in voltage of the write signal may occur as the write signal traverses the SOT layer 112. However, the shunting layer 114 comprises a highly conductive material and/or has a suitable thickness, such that the shunting layer 114 may, for example, reduce the drop in voltage of the write signal as it traverses the SOT layer 112 (e.g., because current may more easily travel through a conductor with greater cross-sectional area and/or higher conductivity). This in turn may reduce a magnitude of voltage pulse utilized to change the magnetization direction of the free layer, thereby reducing the write power consumption of the IC 400. In further embodiments, the reduced voltage mitigates heat that would otherwise be generated by high current density flowing through an un-shunted SOT layer 112, thereby also mitigating or eliminating damage to the SOT layer 112 and/or the memory cell 116. This increases the number of write operations that may be performed on the memory cell 116, thereby increasing the performance and endurance of the IC 400.

Figure 5:
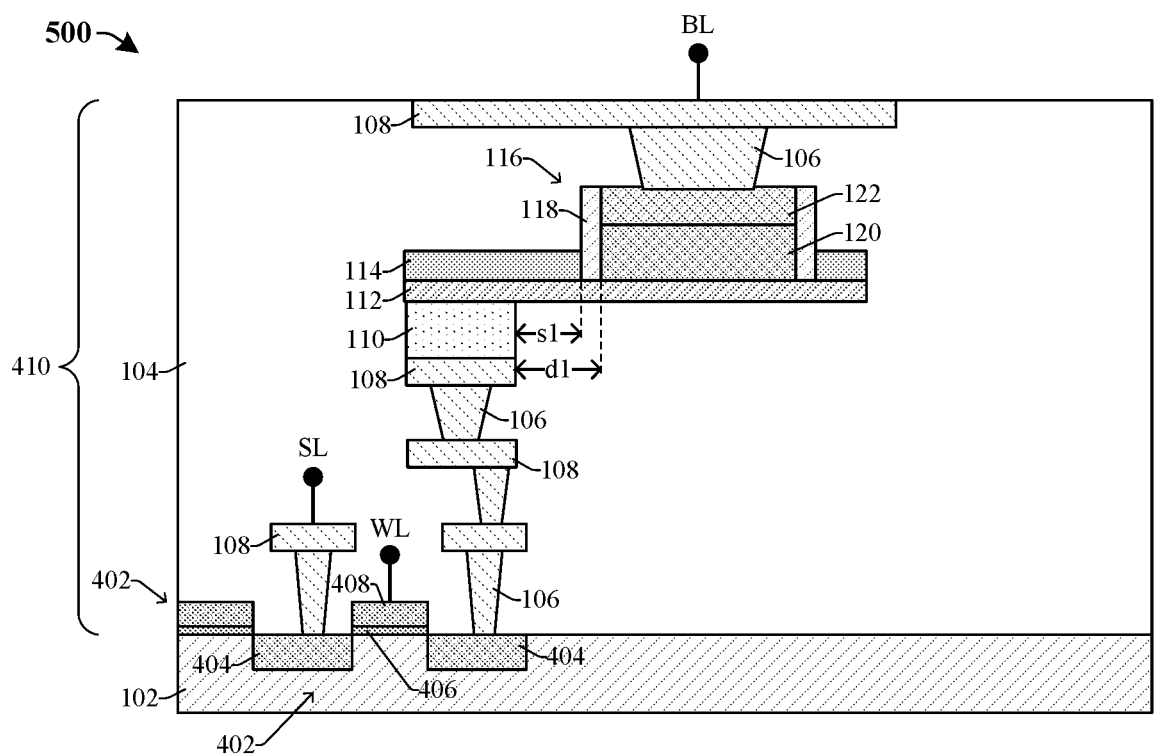
FIG. 5 illustrates a cross-sectional view of some embodiments of an IC including a shunting layer laterally enclosing a two-terminal SOT-MRAM cell disposed within an interconnect structure.

FIG. 5 illustrates a cross-sectional view of some embodiments of an IC 500 according to some alternative embodiments of the IC 400 of FIG. 4.

The memory cell 116 is disposed within the interconnect structure 410. In some embodiments, the BEVA 110 is configured as a first terminal and the conductive via 106 overlying the memory cell 116 is configured as a second terminal, such that the memory cell 116 is configured as a two-terminal SOT-MRAM cell. A conductive wire of the plurality of conductive wires 108 is electrically coupled to a source line (SL) and a gate electrode 408 of a semiconductor device 402 is electrically coupled to a word line (WL). In some embodiments, a write signal (e.g., a current and/or a voltage) may be applied across the SOT layer 112 by way of the SL and the WL, such that the write signal traverses the distance d1 between the BEVA 110 and the memory cell 116. As discussed above, the shunting layer 114 is configured to mitigate and/or largely eliminate a drop in voltage across the distance s1, thereby decreasing a power consumption of the IC 400.

Figure 6:
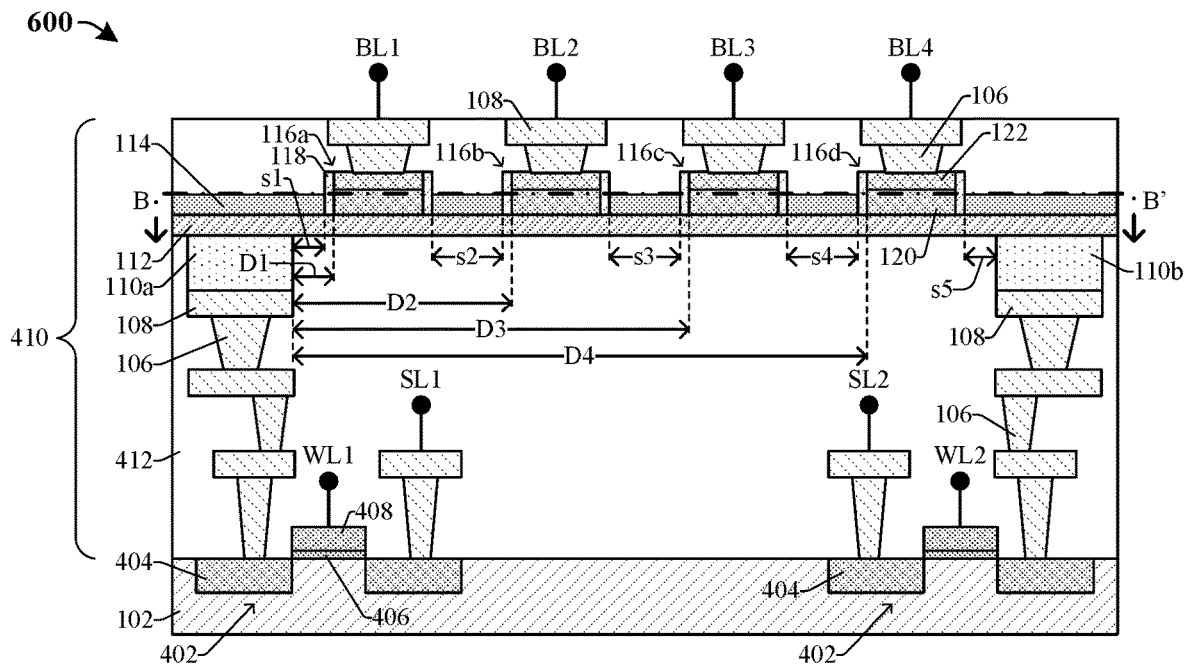
FIG. 6 illustrates a cross-sectional view of some alternative embodiments of the IC of FIG. 4.

FIG. 6 illustrates a cross-sectional view of some embodiments of an IC 600 that are alternatives to embodiments of the IC 400 of FIG. 4, in which a plurality of memory cells 116a-d are disposed along the upper surface of the SOT layer 112.

In some embodiments, the memory cells 116a-d may each be configured as the memory cell 116 of FIGS. 1A-C. In some embodiments, the shunting layer 114 overlies the SOT layer 112 and continuously wraps around the memory cells 116a-d. In some embodiments, the memory cells 116a-d may be electrically coupled to bit lines BL1-4, respectively. In some embodiments, during operation of the IC 600, a write signal (e.g., a current and/or a voltage) may be applied across the SOT layer 112 from the first BEVA 110a to the second BEVA 110b, or vice versa. In such embodiments, the write signal traverses along the SOT layer 112 between the first BEVA 110a and the second BEVA 110b. Whether or not memory cells 116a, 116b, 116c, and 116d are written is controlled by voltages applied to bit lines BL1, BL2, BL3, and BL4, respectively, with the required inhibition voltage determined by the Voltage Controlled Magnetic Anisotropy (VCMA) effect. Voltages applied to the bit lines BL1, BL2, BL3, and BL4 can serve to enhance or inhibit the SOT writing of their corresponding memory cells 116a-d by decreasing or increasing the magnetic anisotropy of each cell's respective free layer. In some embodiments according to the present disclosure, the distances D1-D4 are defined between the memory cells 116a-d and the first BEVA 110a, respectively. In some embodiments, a second distance D2 is greater than a first distance D1, a third distance D3 is greater than the second distance D2, and/or a fourth distance D4 is greater than the third distance D3. The shunting layer 114 is configured to mitigate and/or largely eliminate a drop in voltage as the write signal traverses the distances s1, s2, s3, s4, and s5, thereby decreasing the power consumption of the IC 600.

Figure 7A:
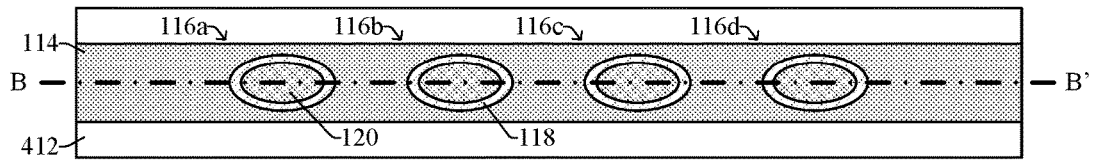
FIGS. 7A-C illustrate top views according to some alternative embodiments of the integrated chip of FIG. 6 taken along the line B-B'.

FIG. 7A illustrates a top view 700a of some alternative embodiments of the IC 600 of FIG. 6 according to the line B-B'. In some embodiments, the memory cells 116a-d may each have a circular and/or elliptical shape when viewed from above. The shunting layer 114 may laterally wrap around the memory cells 116a-d.

Figure 7B:
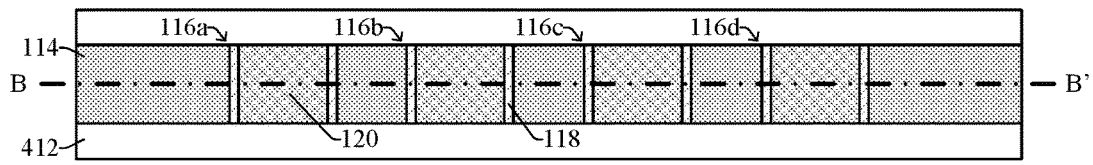
Figure 7C:
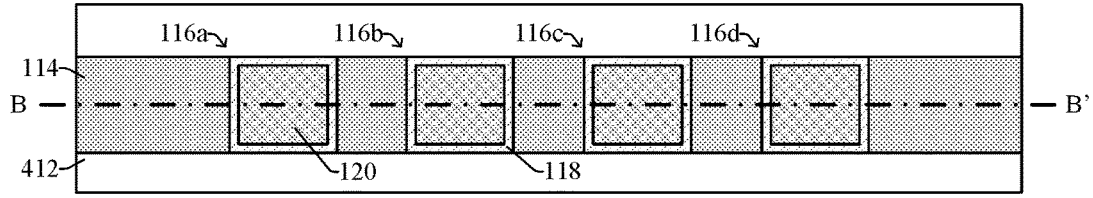

FIGS. 7B and 7C illustrate top views 700b and 700c corresponding to some alternative embodiments of the IC 600 of FIG. 6 according to the line B-B', in which the memory cells 116a-d may each have a rectangular shape when viewed from above.

FIGS. 8-21 illustrate various views 800-2100 of some embodiments of a method of forming a memory device including a magnetic tunnel junction (MTJ) structure overlying a spin orbit torque (SOT) layer and a shunting layer disposed along an upper surface of the SOT layer. Although the various views 800-2100 shown in FIGS. 8-21 are described with reference to a method, it will be appreciated that the structures shown in FIGS. 8-21 are not limited to the method but rather may stand alone separate of the method. Furthermore, although FIGS. 8-21 are described as a series of acts, it will be appreciated that these acts are not limited in that the order of the acts can be altered in other embodiments, and the methods disclosed are also applicable to other structures. In other embodiments, some acts that are illustrated and/or described may be omitted in whole or in part.

Figure 8:
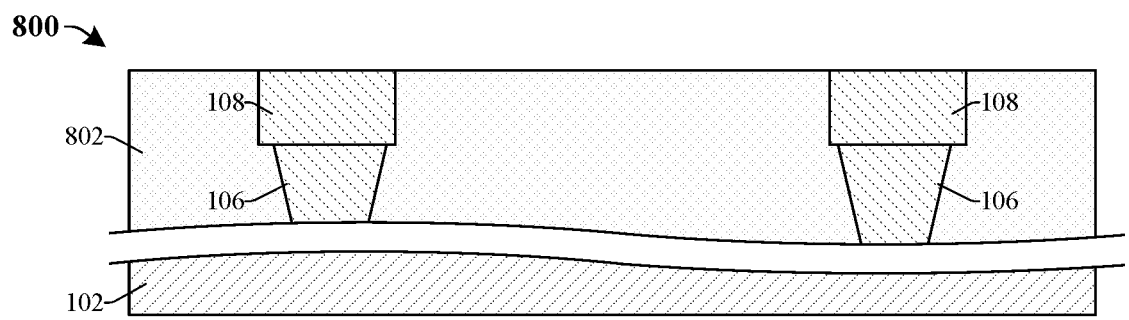
FIGS. 8-21 illustrate various views of some embodiments of a method of forming a memory device including a magnetic tunnel junction (MTJ) structure overlying a spin orbit torque (SOT) layer and a shunting layer disposed along an upper surface of the SOT layer.

As shown in cross-sectional view 800 of FIG. 8, a substrate 102 is provided and a first inter-level dielectric (ILD) layer 802 is formed over the substrate 102. In some embodiments, the first ILD layer 802 may be deposited by chemical vapor deposition (CVD), physical vapor deposition (PVD), atomic layer deposition (ALD), or another suitable deposition process. In further embodiments, the first ILD layer 802 may, for example, be or comprise an oxide, such as silicon dioxide, a low-k dielectric material, or another suitable dielectric material. Conductive vias 106 and conductive wires 108 may be formed in the first ILD layer 802. In some embodiments, the conductive vias 106 and/or the conductive wires 108 may, for example, be formed by a single damascene process or a dual damascene process.

Figure 9:
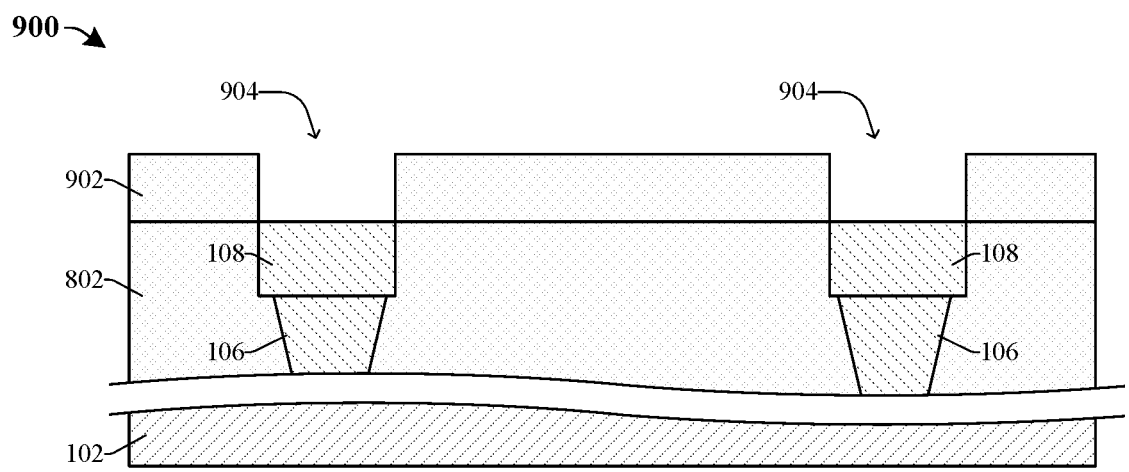

As shown in cross-sectional view 900 of FIG. 9, a second ILD layer 902 is formed over the first ILD layer 802. In some embodiments, the second ILD layer 902 may, for example, be deposited by CVD, PVD, ALD, or another suitable deposition process. In some embodiments, the second ILD layer 902 may, for example, be or comprise silicon dioxide, an extreme low-k dielectric material, silicon nitride, or the like. Further, after forming the second ILD layer 902, a patterning process may be performed on the second ILD layer 902 to define a plurality of openings 904 in the second ILD layer 902. In some embodiments, the patterning process may expose an upper surface of the conductive wires 108. In further embodiments, the patterning process may include:

forming a masking layer (not shown) over the second ILD layer 902; exposing unmasked regions of the second ILD layer 902 to one or more etchants, thereby defining the plurality of openings 904; and performing a removal process to remove the masking layer.

Figure 10A:
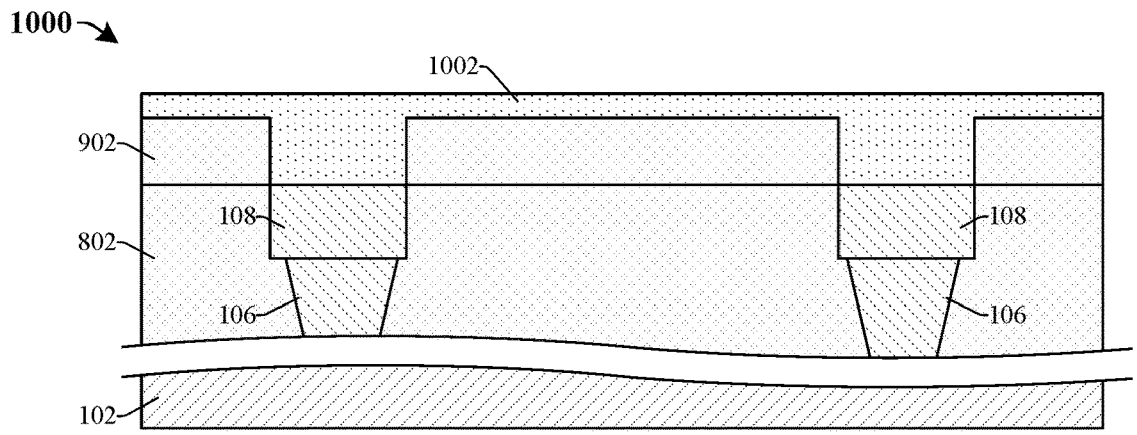

As shown in cross-sectional view 1000 of FIG. 10A, a conductive structure 1002 is formed over the second ILD layer 902. In some embodiments, the conductive structure 1002 may, for example, be or comprise copper, aluminium, tungsten, a combination of the foregoing, or the like. Further, in some embodiments, the conductive structure 1002 may, for example, be deposited by CVD, ALD, electroplating, PVD, another suitable deposition or growth process, or a combination of deposition or growth processes. In some embodiments, while conductive structure 1002 is illustrated as having a smooth and flat top surface, it may in fact have a roughness reflecting the underlying template the growth is started and the deposition methods. In further embodiments, after depositing the conductive structure 1002 it may be planarized by a chemical mechanical (CMP) process to substantially smooth it, as is illustrated.

Figure 10B:
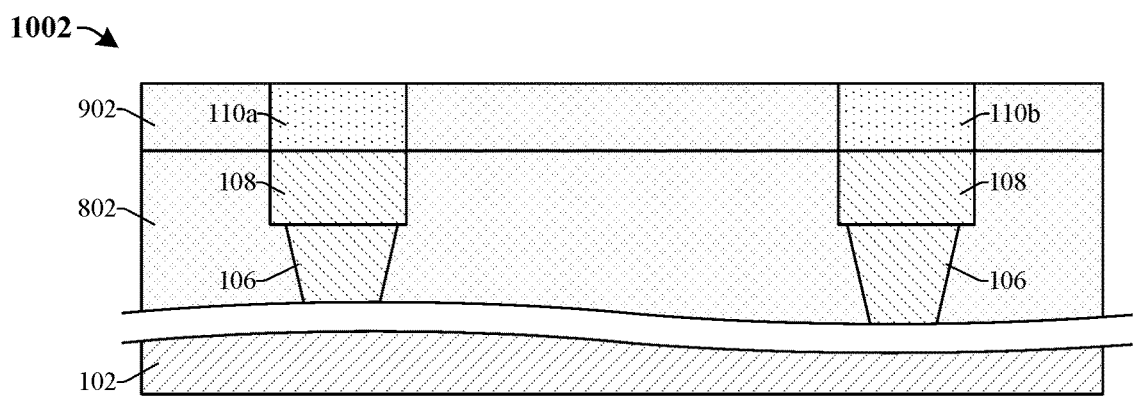

As shown in cross-sectional view 1002 of FIG. 10B, a planarization process (e.g., a chemical mechanical planarization (CMP) process) is performed on the conductive structure (1002 of FIG. 10A) until an upper surface of the second ILD layer 902 is reached, thereby defining a first BEVA 110a and a second BEVA 110b.

Figure 11:
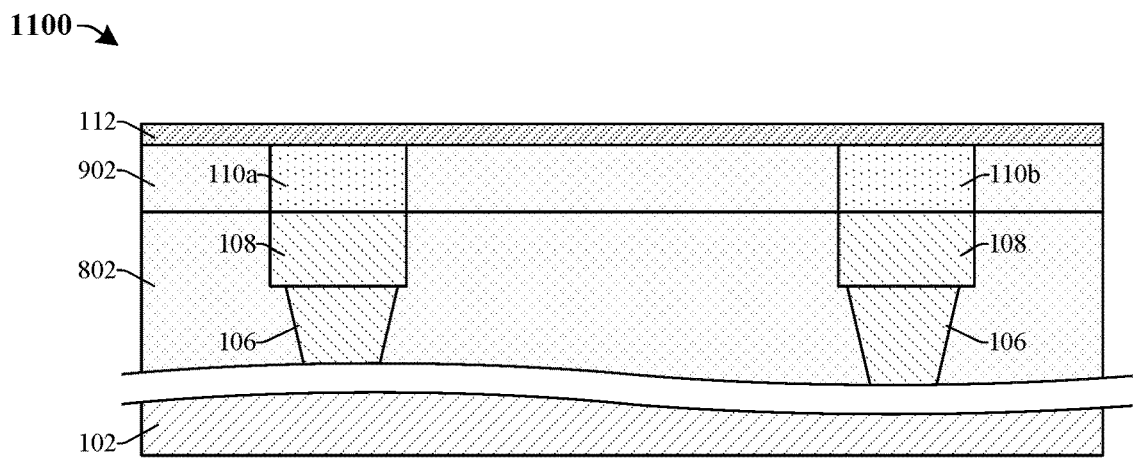

As shown in cross-sectional view 1100 of FIG. 11, an SOT layer 112 is formed over the second ILD layer 902, the first BEVA 110a, and the second BEVA 110b. In some embodiments, the SOT layer 112 may, for example, be deposited by CVD, PVD, electroless plating, sputtering, electroplating, or another suitable deposition or growth process. In further embodiments, the SOT layer 112 may, for example, be or comprise tungsten, tantalum, platinum, an alloy of palladium and platinum (e.g., $Pd_{0.25}Pt_{0.75}$), an alloy of gold and platinum (e.g., $Au_{0.25}Pt_{0.75}$), or the like and/or may have a thickness of about 4 nanometers.

Figure 12:
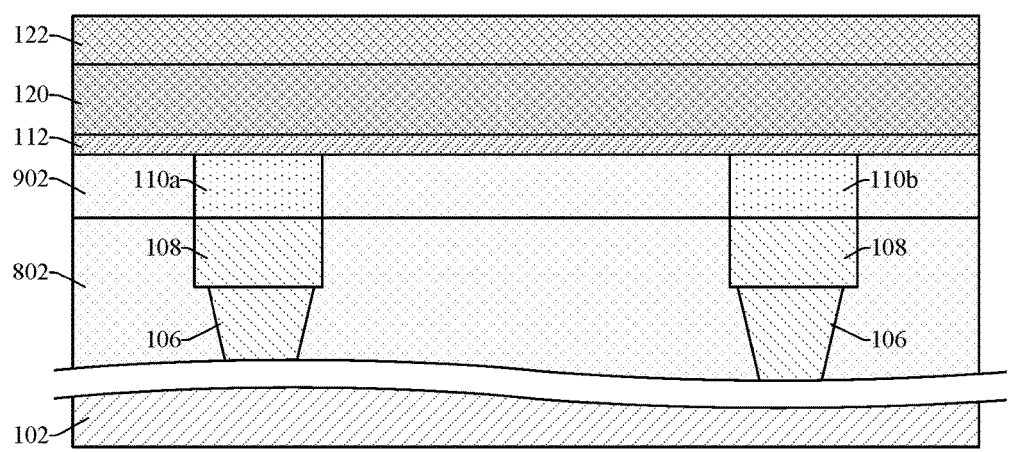

As shown in cross-sectional view 1200 of FIG. 12, a magnetic tunnel junction (MTJ) structure 120 is formed over the SOT layer 112. In some embodiments, the MTJ structure 120 is formed immediately after forming the SOT layer 112. In some embodiments, the MTJ structure 120 may, for example, be deposited by one or more of the following: CVD, PVD, electroless plating, electroplating, or another suitable growth or deposition process. In some embodiments, the MTJ structure 120 may comprise a plurality of layers (e.g., as illustrated and described in FIGS. 3A-3C). Further, a capping structure 122 may be formed over the MTJ structure 120. In some embodiments, the capping structure 122 may, for example, be deposited by one or more of the following: CVD, PVD, electroless plating, electroplating, or another suitable growth or deposition process. In some embodiments, the capping structure 122 may comprise a plurality of layers (e.g., as illustrated and described in FIGS. 3A-3C).

FIGS. 13A-C, 14A-B, and 15A-B illustrate various views 1300a-c, 1400a-b, and 1500a-b corresponding to a first embodiment of the method. FIGS. 16A-B, 17A-B, 18A-B, and 19A-B illustrate various views 1600a-b, 1700a-b, 1800a-b, and 1900a-b corresponding to an alternative, second embodiments of the method.

Figure 13A:
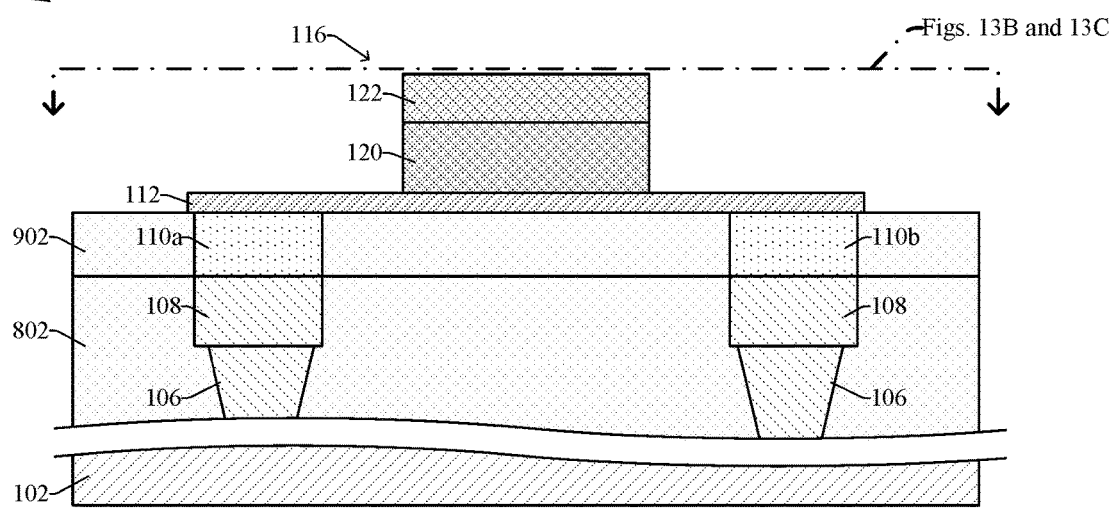

As shown in cross-sectional view 1300a of FIG. 13A, the MTJ structure 120, the capping structure 122, and/or the SOT layer 112 are patterned, thereby defining a memory cell 116. In some embodiments, a method for patterning the MTJ structure 120 and the capping structure 122 may include: forming a masking layer (not shown) over the capping structure 122; exposing unmasked regions of the capping structure 122 and the MTJ structure 120 to one or more etchants, thereby defining the memory cell 116; and performing a removal process to remove the masking layer. In some embodiments, the SOT layer 112 may act as an etch stop layer during the patterning process of the MTJ structure 120.

Figure 13B:
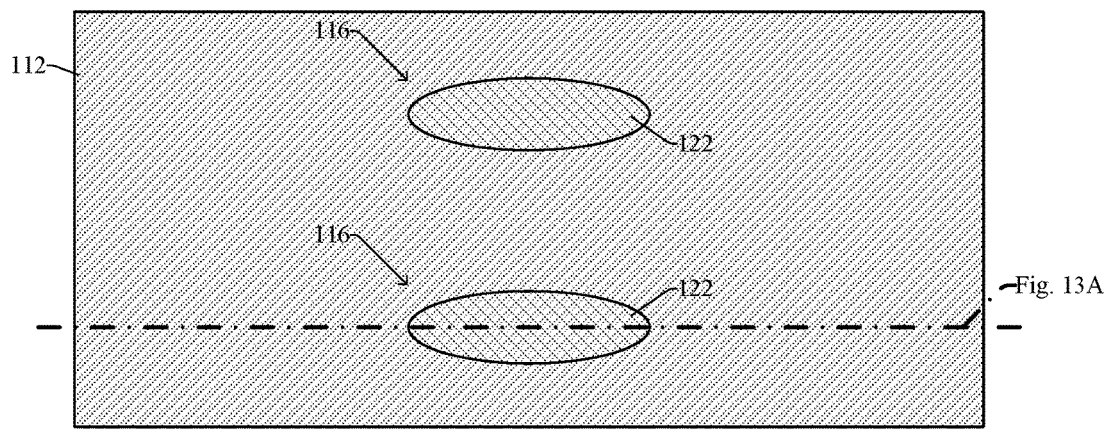
Figure 13C:
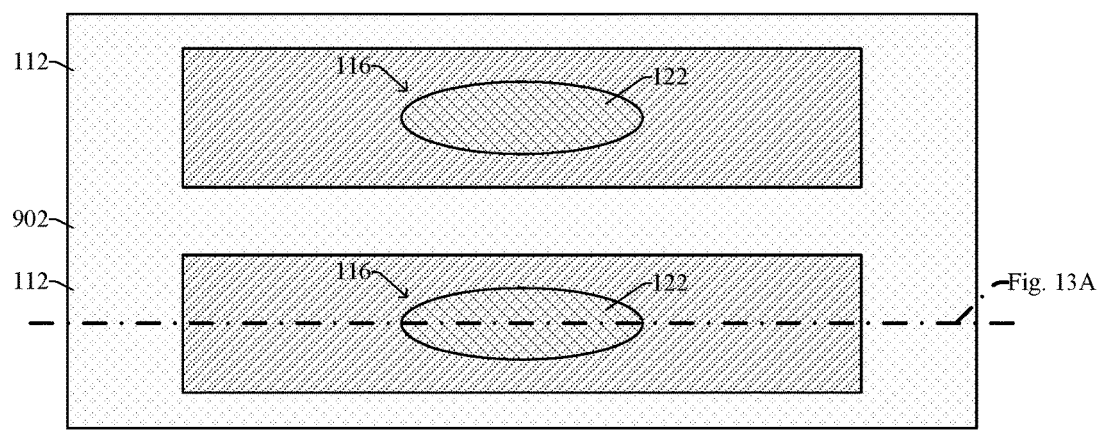

FIGS. 13B and 13C illustrate some embodiments of top views 1300b and 1300c corresponding to the cross-sectional view 1300a of FIG. 13A taken from above the plane illustrated by the dashed line in FIG. 13A at two different times during the fabrication process for the capping structure 122, the MTJ structure 120, and the SOT layer 112. In some embodiments, the top view 1300b of FIG. 13B illustrates an alternative embodiment of the patterning process of FIG. 13A, in which a first etching process is performed to define the memory cell 116 such that the SOT layer 112 is not etched. In such embodiments, a second etching process may be performed to remove portions of the SOT layer 112.

After performing the patterning process of FIG. 13A, the memory cell 116 may have an elliptical shape or a circular shape when viewed from above, as illustrated in FIG. 13C for the elliptical shape. In further embodiments, as illustrated in FIG. 13C, after defining the memory cell 116, a second patterning process may be performed to remove at least a portion of the SOT layer 112. In some embodiments, a process for the second patterning process may include: forming a masking layer (not shown) over the memory cell 116 and the SOT layer 112; exposing unmasked regions of the SOT layer 112 to one or more etchants; and performing a removal process to remove the masking layer. In yet further embodiments, the second patterning process or part of the process may be a part of the patterning process of the MTJ structure 120 and the capping structure 122.

Figure 14A:
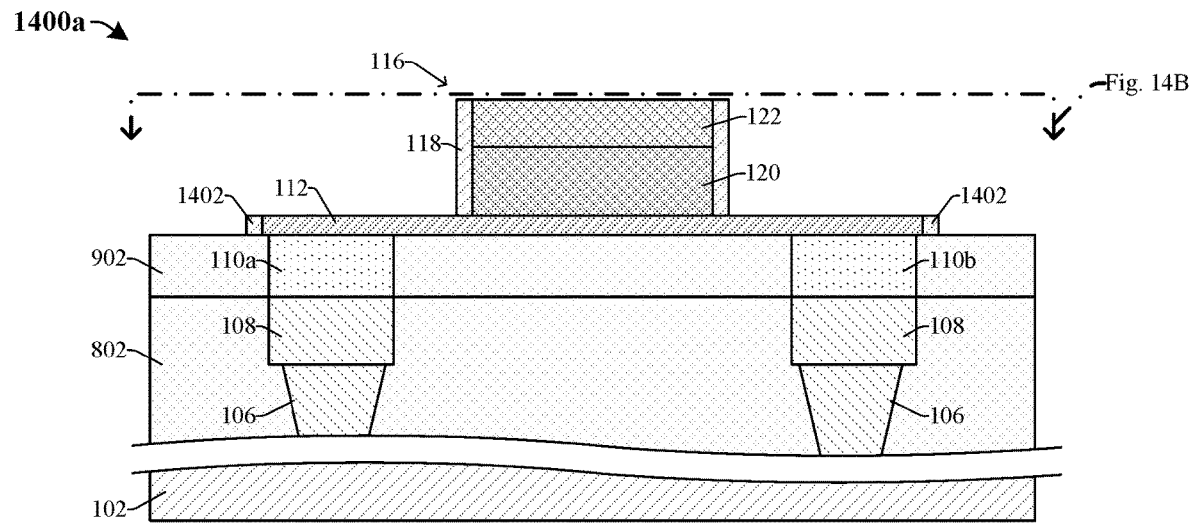

As shown in cross-sectional view 1400a of FIG. 14A, a sidewall spacer structure 118 is formed along a sidewall of the memory cell 116 and an SOT sidewall spacer structure 1402 is formed along sidewalls of the SOT layer 112. In some embodiments, the sidewall spacer structure 118 and/or the SOT sidewall spacer structure 1402 may, for example, respectively be or comprise silicon nitride, silicon carbide, aluminum oxide, or another suitable dielectric material. In further embodiments, a method for forming the sidewall spacer structure 118 and/or the SOT sidewall spacer structure 1402 may include: depositing a conformal dielectric material (e.g., by CVD, ALD, or another suitable deposition process) over the structure of FIG. 13A; and performing an anisotropic etch to remove the dielectric material from horizontal surfaces of the structure of FIG. 13A, thereby defining the sidewall spacer structure 118 and the SOT sidewall spacer structure 1402. Thus, in some embodiments, the sidewall spacer structure 118 is formed concurrently with a SOT sidewall spacer structure 1402.

Figure 14B:
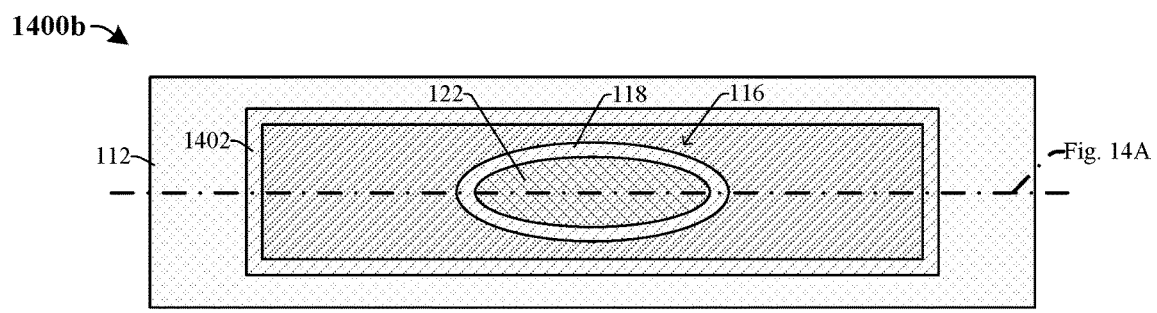

FIG. 14B illustrates a top view 1400b corresponding to some alternative embodiments represented by the cross-sectional view 1400a of FIG. 14A taken from above the plane indicated by the dashed line in FIG. 14A. As illustrated in FIG. 14B the sidewall spacer structure 118 may laterally enclose the memory cell 116 and the SOT sidewall spacer structure 1402 may laterally enclose the SOT layer 112.

In some embodiments, FIGS. 13A-C and 14A-B illustrate a method in which the SOT layer 112 is patterned before the sidewall spacer structure 118 is formed around the MTJ structure 120. In some embodiments, the sidewall spacer structure 118 may first be formed around the MTJ structure 120 prior to patterning of the SOT layer 112 (e.g., see FIGS. 23A-B and 24A-B).

Figure 15A:
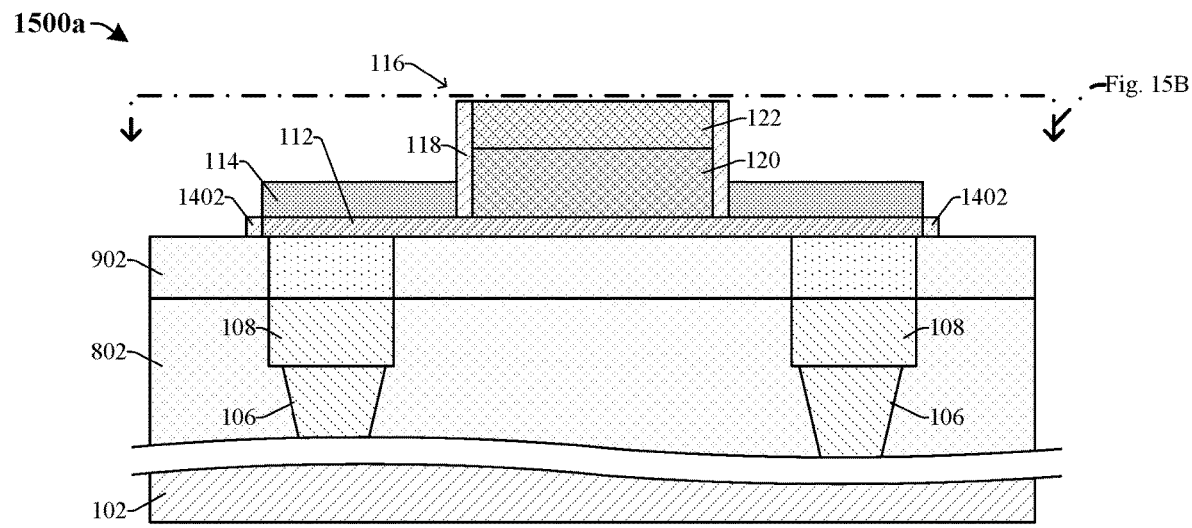

As shown in cross-sectional view 1500*a* of FIG. 15A, a shunting layer 114 is formed over the SOT layer 112. In some embodiments, the shunting layer 114 may, for example, be deposited by CVD, PVD, ALD, electroless plating, or another suitable deposition or growth process. In further embodiments, the shunting layer 114 may be solely deposited by electroless plating. In some embodiments, the SOT layer 112 serves as the electroless plating seed layer and may for example be comprised of Pt, Pd(1−x)Pt(x), Au(1−x)Pt(x) alloy, W, Ta, or the like and the shunting layer 114 may be comprised of Cu. In some of these embodiments, x is about 25% or is within a range of about 20% to 30%.

Figure 15B:
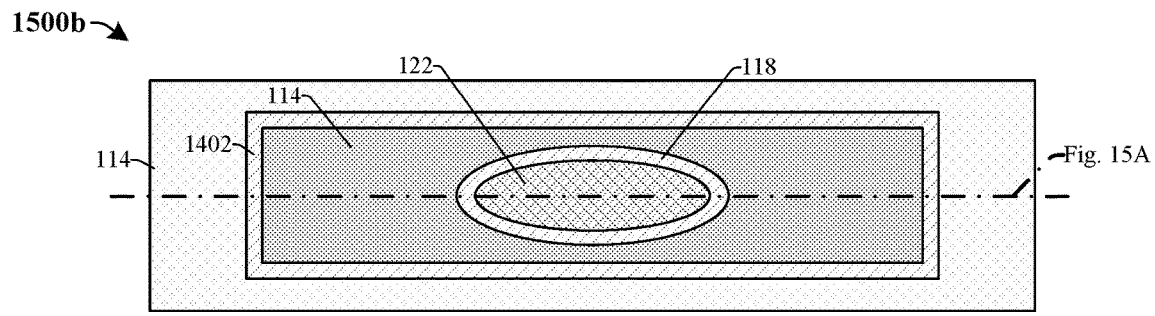

FIG. 15B illustrates a top view 1500*b* corresponding to some alternative embodiments illustrated by the cross-sectional view 1500*a* of FIG. 15A taken along the dashed line in FIG. 15A. As illustrated in FIG. 15B the shunting layer 114 laterally surrounds the sidewall spacer structure 118.

In some embodiments, during operation, the electrical current conducted through the SOT layer 112 and the shunting layer 114 around the outside of the MTJ structure 120 may not provide assistance to a writing process. To mitigate against this, in some embodiments, the MTJ structure 120, the SOT layer 112, and/or the shunting layer 114 may be patterned such that the widths of the SOT layer 112 extending laterally beyond the MTJ structure 120 are minimized and/or eliminated. In such embodiments, this can be achieved by substantially aligning and controlling patterned dimensions. However, in further embodiments, FIGS. 16A-B, 17A-B, 18A-B, and 19A-B illustrate a second patterning method, in which the SOT layer 112 or the SOT layer 112 and the shunting layer 114 are self-aligned around the MTJ structure 120.

Figure 16A:
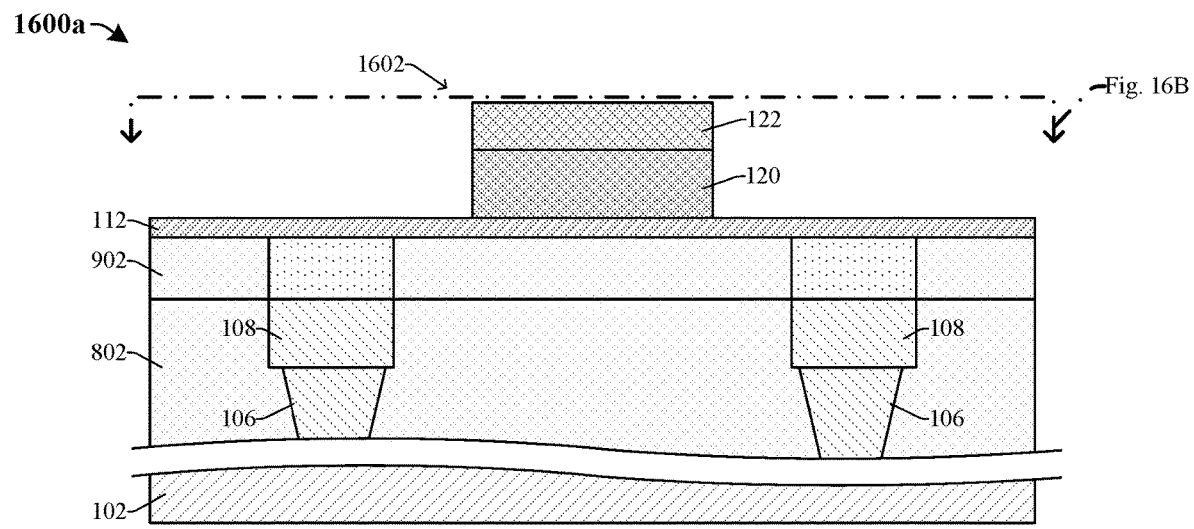

In the patterning alternative, as shown in cross-sectional view 1600*a* of FIG. 16A, a first patterning process is performed on the MTJ structure 120 and the capping structure 122, thereby defining a memory structure 1602. In some embodiments, the first patterning process may include: forming a masking layer (not shown) over the capping structure 122; exposing unmasked regions of the capping structure 122 and the MTJ structure 120 to one or more etchants, thereby defining the memory structure 1602; and performing a removal process to remove the masking layer. In some embodiments, the SOT layer 112 may act as an etch stop layer during the first patterning process, such that the first patterning process does not etch through the SOT layer 112.

Figure 16B:
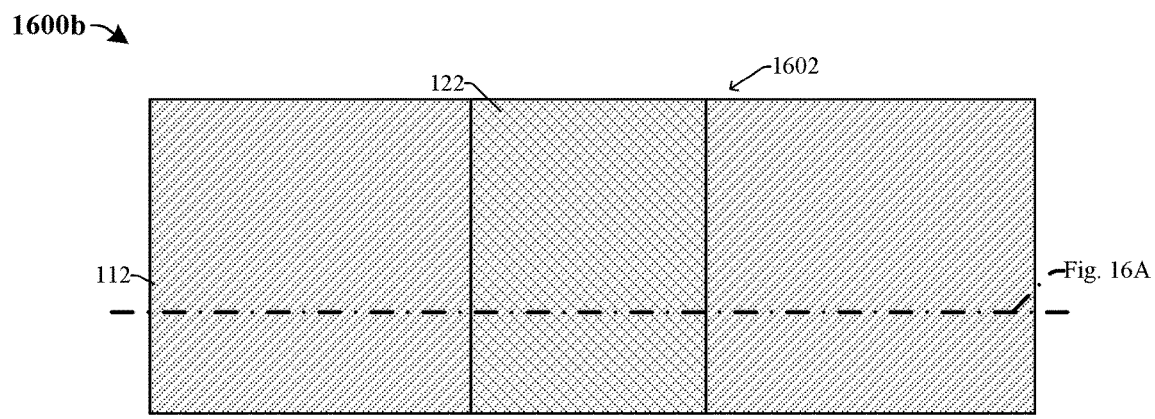

FIG. 16B illustrates a top view 1600*b* corresponding to some alternative embodiments of the cross-sectional view 1600*a* of FIG. 16A taken along the dashed line in FIG. 16A. As illustrated in FIG. 16B the memory structure 1602 has a rectangular shape when viewed from above.

Figure 17A:
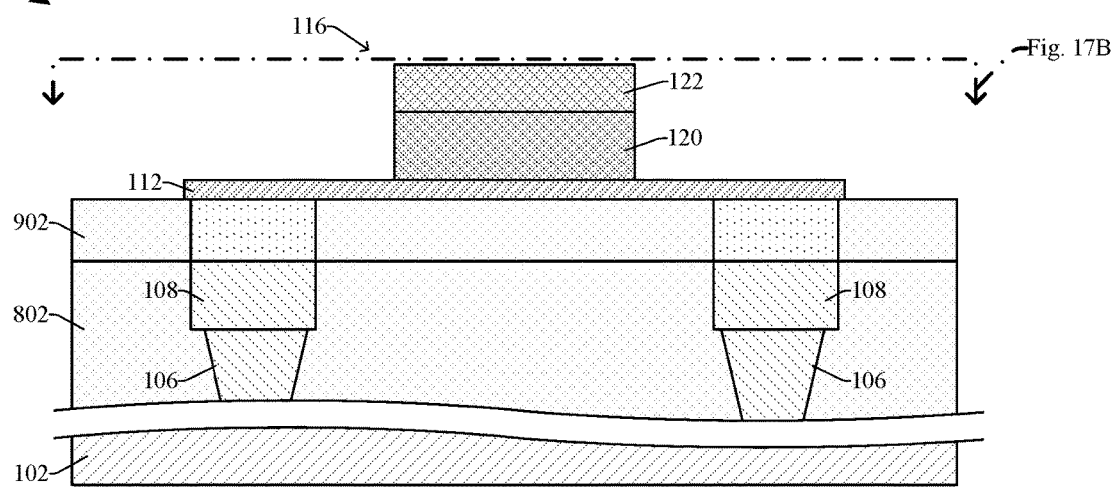
Figure 17B:
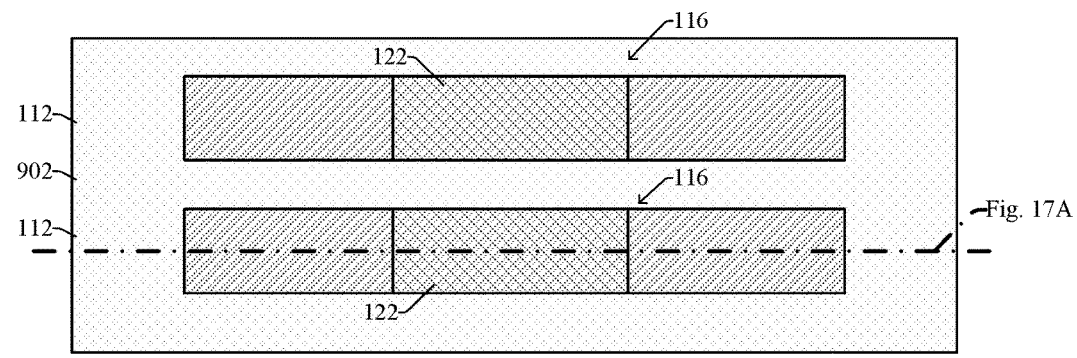

As shown in top view 1700*b* of FIG. 17B and cross-sectional view 1700*a* of FIG. 17A, a second patterning process is performed on the structure of FIG. 16A. In some embodiments, the second patterning process may include: forming a masking layer (not shown) over the capping structure 122 and the SOT layer 112; exposing unmasked regions of the capping structure 122, the MTJ structure 120, and the SOT layer 112 to one or more etchants, thereby defining one or more memory cell(s) 116; and performing a removal process to remove the masking layer. In some embodiments, the second patterning process may etch through regions of the SOT layer 112 and expose an upper surface of the second ILD layer 902. As illustrated in FIG. 17B, the one or more memory cell(s) 116 may have a rectangular shape when viewed from above. FIG. 17A illustrates the cross-sectional view 1700*a* corresponding to some alternative embodiments of the top-down view 1700*b* of FIG. 17B taken along the dashed line in FIG. 17B.

Figure 18A:
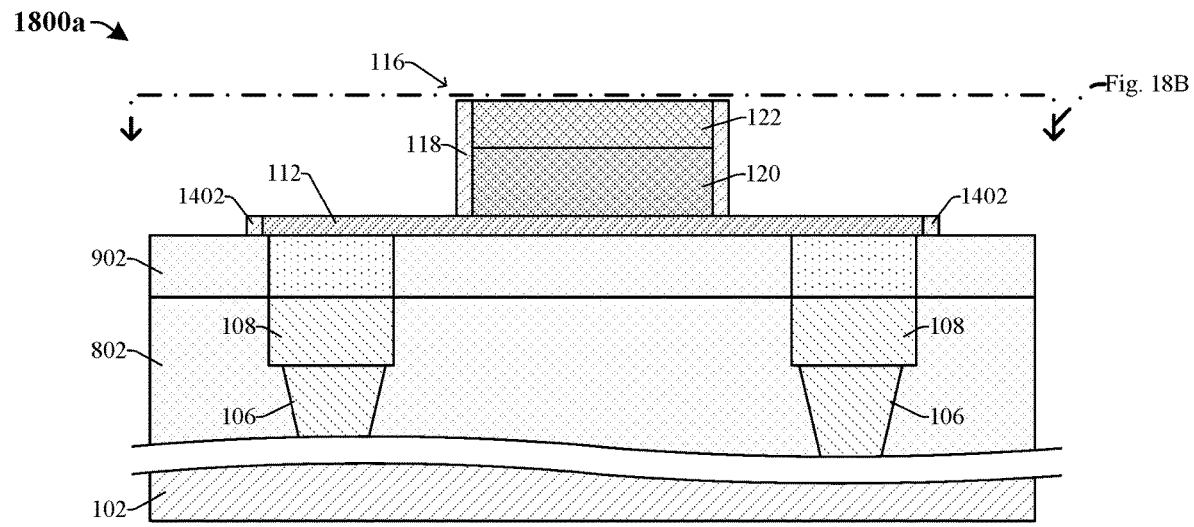

As shown in cross-sectional view 1800*a* of FIG. 18A, a sidewall spacer structure 118 is formed along the sidewalls of the memory cell 116, and an SOT sidewall spacer structure 1402 is formed along sidewalls of the SOT layer 112. In some embodiments, the sidewall spacer structure 118 and/or the SOT sidewall spacer structure 1402 may, for example, respectively be or comprise silicon dioxide, silicon nitride, silicon carbide, aluminum oxide, or the like. In further embodiments, a method for forming the sidewall spacer structure 118 and/or the SOT sidewall spacer structure 1402 may include: depositing a conformal dielectric material (e.g., by CVD, ALD, or another suitable deposition process) over the structure of FIG. 17A; and performing an etching process on the dielectric material to remove fixed thickness of the dielectric material from horizontal surfaces of the structure of FIG. 17A, thereby defining the sidewall spacer structure 118 and the SOT sidewall spacer structure 1402. In some embodiments, the etching process may include performing an anisotropic etch process.

Figure 18B:
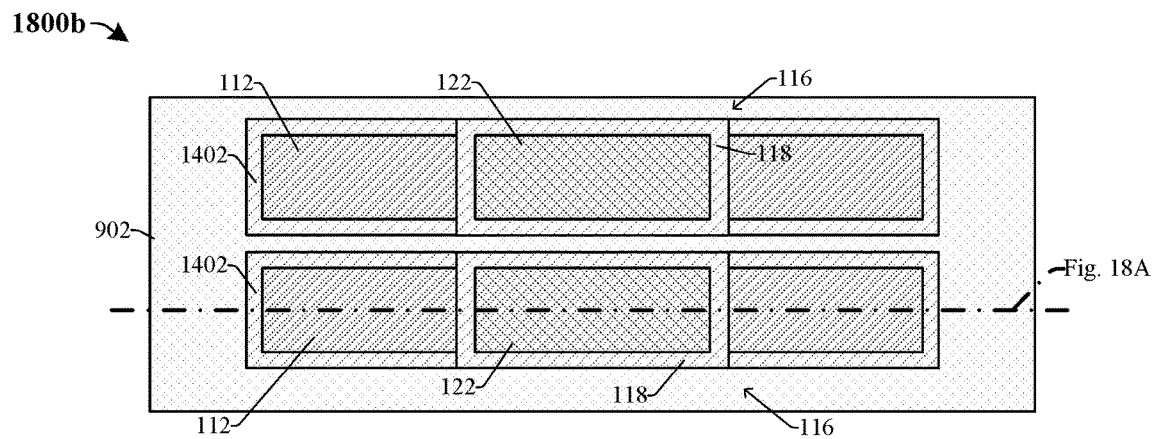

FIG. 18B illustrates a top view 1800*b* corresponding to some alternative embodiments of the cross-sectional view 1800*a* of FIG. 18A taken from above the plane represented by the dashed line in FIG. 18A. As illustrated in FIG. 18B the sidewall spacer structure 118 may laterally enclose the capping structure 122, and the SOT sidewall spacer 1402 may laterally enclose the SOT layer 112.

Figure 19A:
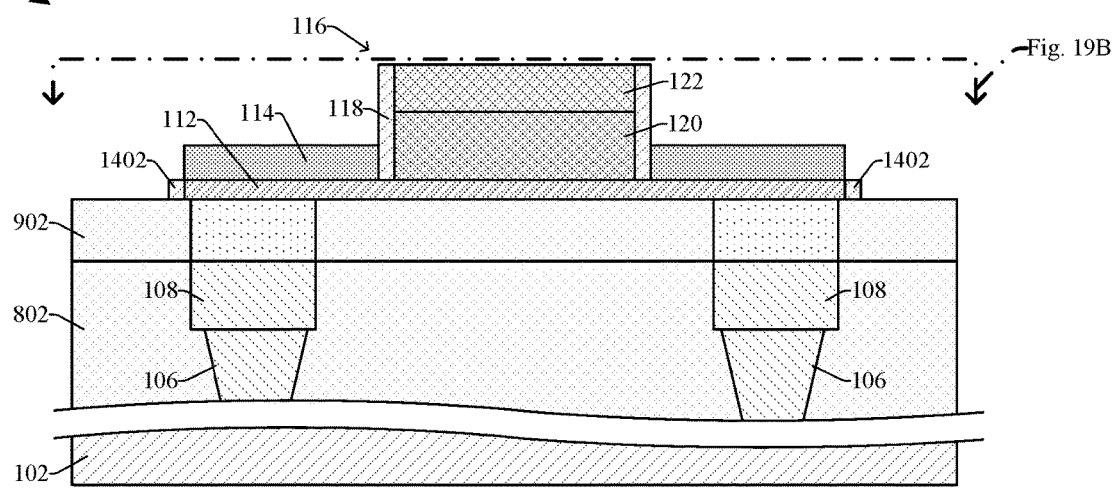

As shown in cross-sectional view 1900*a* of FIG. 19A, a shunting layer 114 is formed over the SOT layer 112. In some embodiments, the shunting layer 114 may, for example, be deposited by CVD, PVD, electroless plating, or another suitable deposition or growth process. In further embodiments, the shunting layer 114 may be solely deposited by electroless plating, with the SOT layer 112 serving as the seed layer for the electroless plating. In some embodiments, the SOT layer 112 serves as the electroless plating seed layer and may for example be comprised of Pt, Pd(1−x)Pt(x), Au(1−x)Pt(x) alloy, W, Ta, or the like and the shunting layer 114 may be comprised of Cu. In some of these embodiments, x is about 25% or is within a range of about 20% to 30%.

Figure 19B:
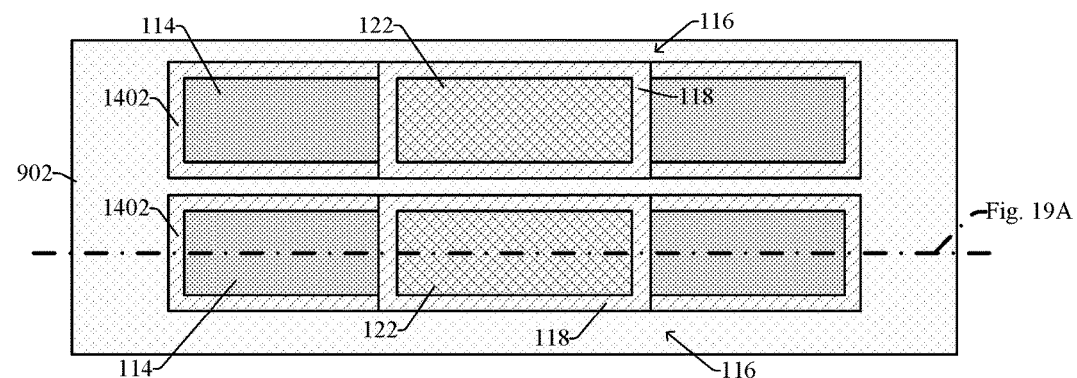

FIG. 19B illustrates a top view 1900*b* corresponding to some alternative embodiments of the cross-sectional view 1900*a* of FIG. 19A taken along the dashed line in FIG. 19A. As illustrated in FIG. 19B the shunting layer 114 is laterally separated from the memory cell 116 by the sidewall spacer structure 118.

Figure 20:
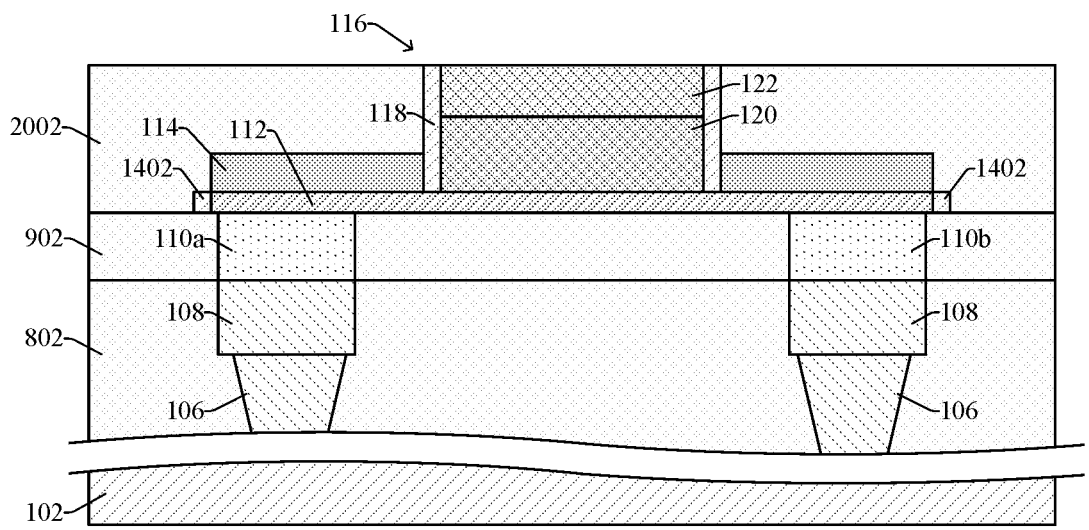

As shown in cross-sectional view 2000 of FIG. 20, a third ILD layer 2002 is formed over the second ILD layer 2002 and the shunting layer 114. In some embodiments, a method for forming the third ILD layer 2002 may include: depositing an ILD dielectric material (e.g., by CVD, PVD, or another suitable deposition process) over the second ILD layer 902, the memory cell 116, and the shunting layers 114; and performing a planarization process (e.g., a CMP process) into the ILD dielectric material until an upper surface of the memory cell 116 is reached, thereby defining the third ILD layer 2002. In some embodiments, the third ILD layer 2002 may, for example, be or comprise silicon dioxide, a low-k dielectric material, or another suitable dielectric material.

In the first embodiment of the method, the method may flow from FIGS. 8-12, 13A-C, 14A-B, and 15A-B to FIG. 20

(i.e., skipping the steps of FIGS. 16A-B, 17A-B, 18A-B, and 19A-B). Alternatively, in the second embodiment of the method, the method may flow from FIGS. 8-12, 16A-B, 17A-B, 18A-B, and 19A-B to FIG. 20 (i.e., skipping the steps of FIGS. 13A-C, 14A-B, and 15A-B).

Figure 21:
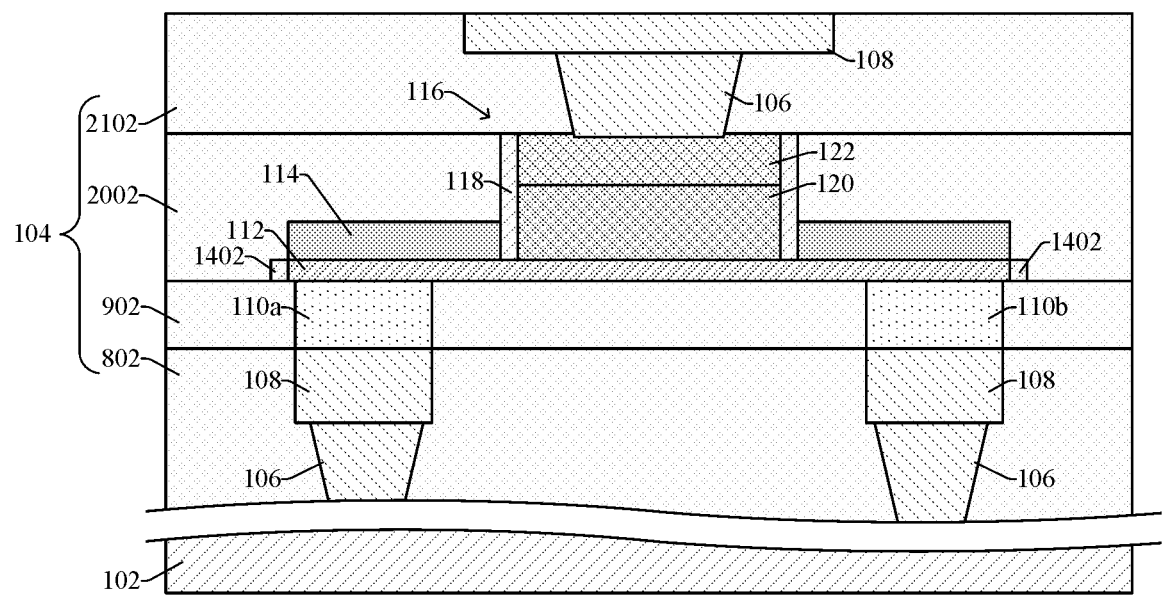

As shown in cross-sectional view 2100 of FIG. 21, a fourth ILD layer 2102, a conductive via 106, and a conductive wire 108 are formed over the memory cell 116. In some embodiments, the fourth ILD layer 2102 may, for example, be or comprise silicon dioxide, a low-k dielectric material, or the like. In some embodiments, the fourth ILD layer 2102 may, for example, be deposited by CVD, PVD, or another suitable deposition process. Additionally, the conductive via 106 and the conductive wire 108 may be formed within the fourth ILD layer 2102 by performing a dual damascene process. In some embodiments, the conductive via 106 overlying the memory cell 116 may directly contact the capping structure 122 and/or may, for example, be or comprise tungsten.

Figure 22:
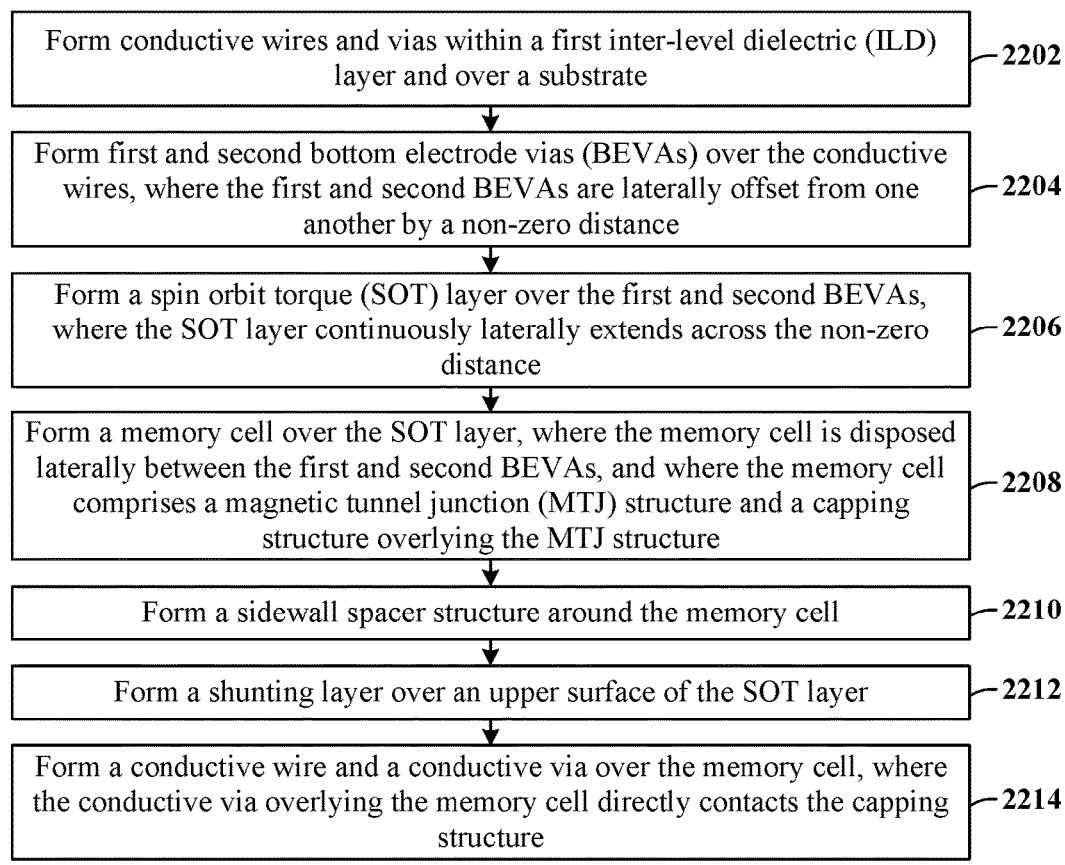
FIG. 22 illustrates a method in flowchart format of some embodiments for forming a magnetic tunnel junction (MTJ) structure over a spin orbit torque (SOT) layer and a shunting layer over the SOT layer.

FIG. 22 illustrates a method 2200 of forming a memory device in accordance with some embodiments. Although the method 2200 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 2202, conductive wires and vias are formed within a first ILD layer and over a substrate. FIG. 8 illustrates a cross-sectional view 800 corresponding to some embodiments of act 2202.

At act 2204, first and second bottom electrode vias (BEVAs) are formed over the conductive wires. The first and second BEVAs are laterally offset from one another by a non-zero distance. FIGS. 9-11 illustrate cross-sectional views 900-1100 corresponding to some embodiments of act 2204.

At act 2206, a spin orbit torque (SOT) layer is formed over the first and second BEVAs. The SOT layer continuously laterally extends across the non-zero distance. FIG. 11 illustrates a cross-sectional view 1100 corresponding to some embodiments of act 2206.

Figure 23A:
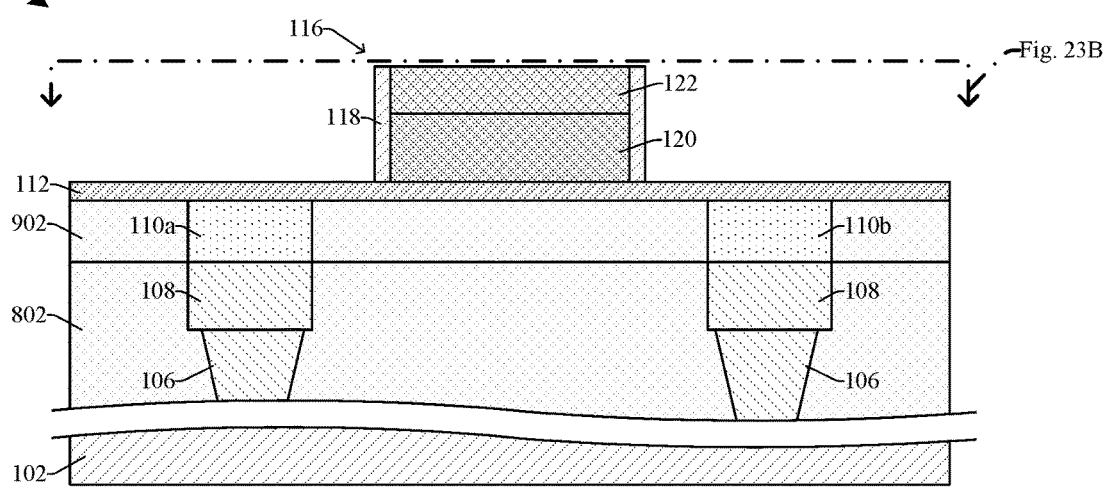
FIGS. 23A-B and 24A-B illustrate various views of some additional alternative embodiments of the method.
Figure 23B:
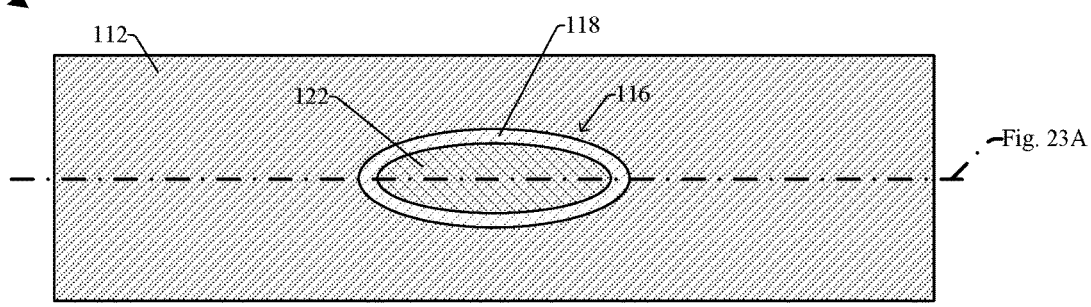
Figure 25A:
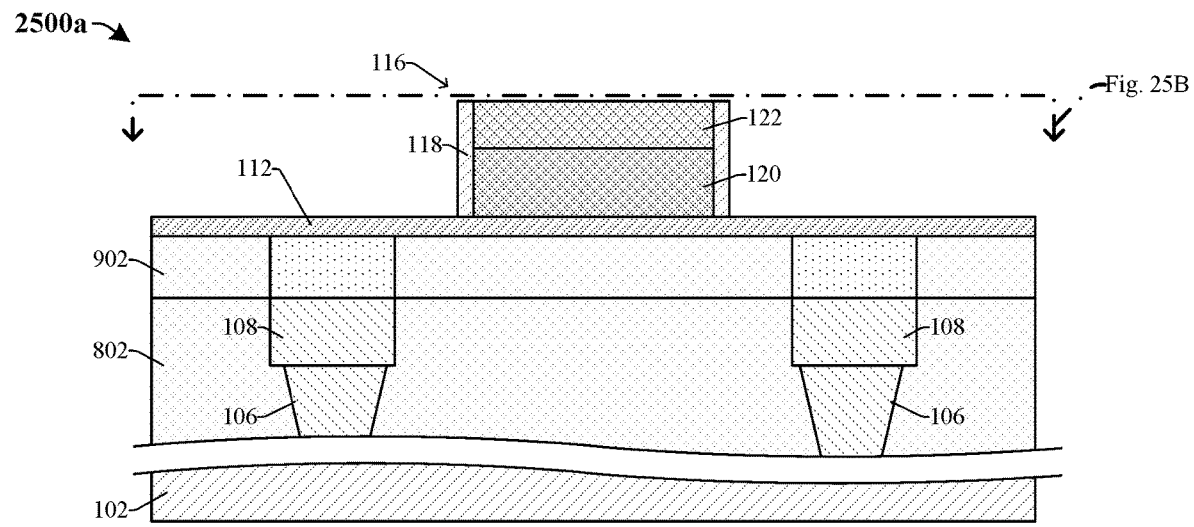
FIGS. 25A-B and 26A-B illustrate various views of some further additional alternative embodiments of the method.
Figure 25B:
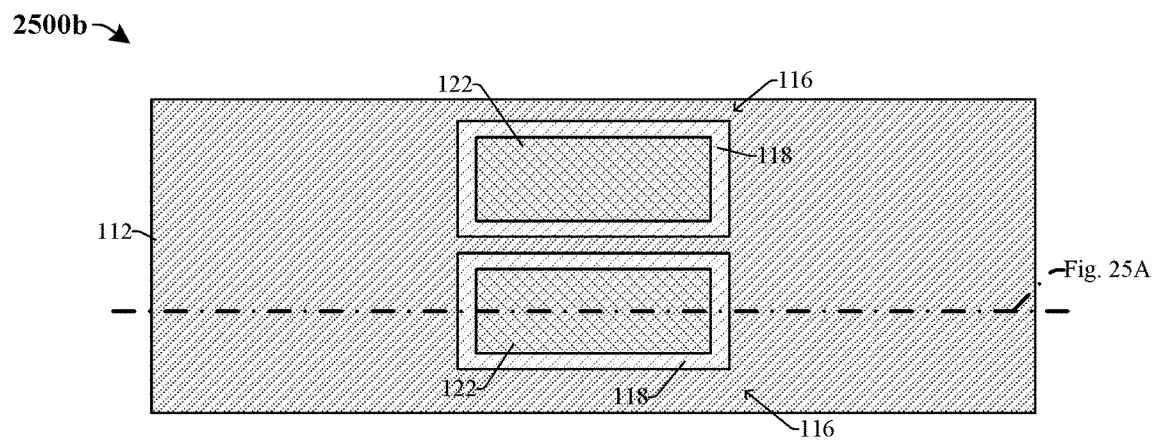

At act 2208, a memory cell is formed over the SOT layer. The memory cell is disposed laterally between the first and second BEVAs, and the memory cell comprises a magnetic tunnel junction (MTJ) structure and a capping structure overlying the MTJ structure. FIGS. 12-13C illustrate various views 1200-1300c corresponding to some embodiments of act 2208. Alternatively, FIGS. 12 and 16A-17B illustrate various views 1200 and 1600a-1700b corresponding to an alternative embodiment of act 2208. Further, FIGS. 12 and 23A-B illustrate various views 1200 and 2300a-b corresponding to a further embodiment of act 2208. Furthermore, FIGS. 12 and 25A-B illustrate various views 1200 and 2400a-b corresponding to another further embodiment of act 2208.

Figure 24A:
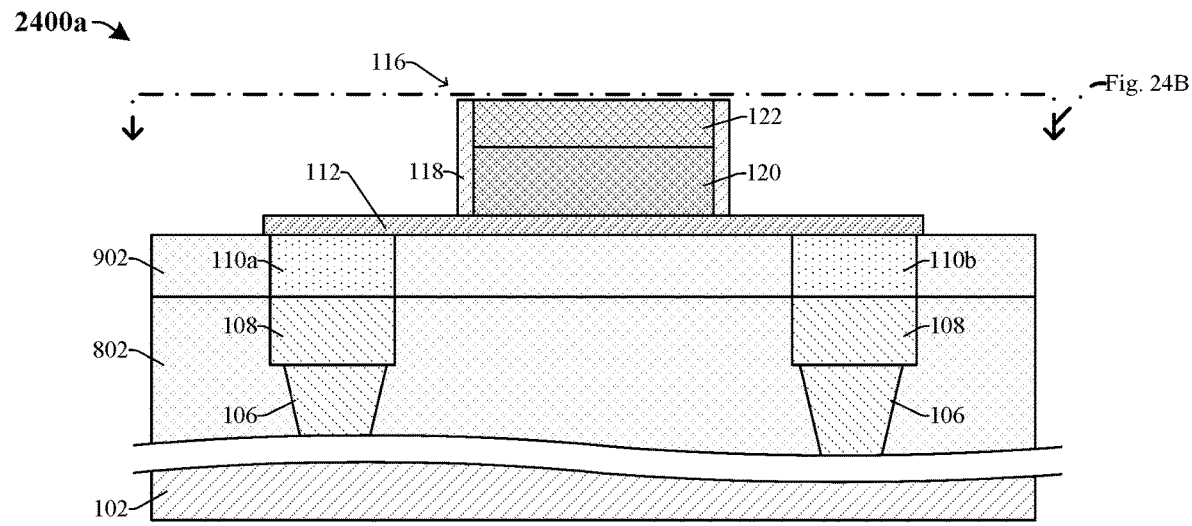
Figure 24B:
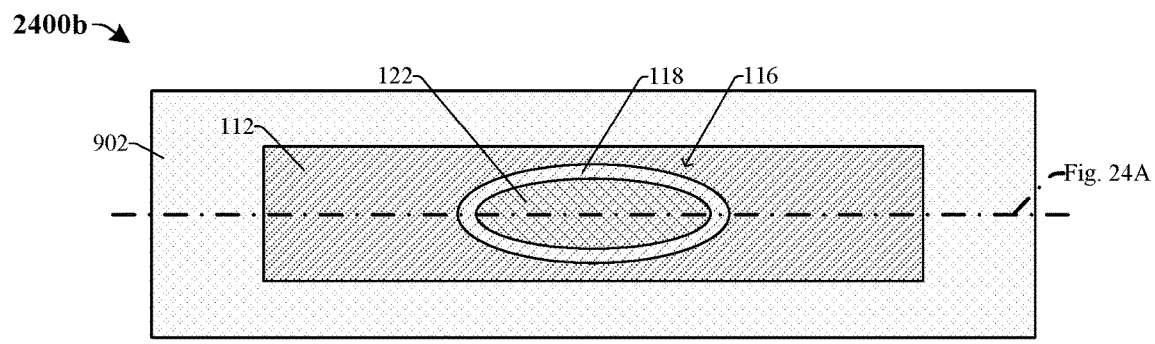
Figure 26A:
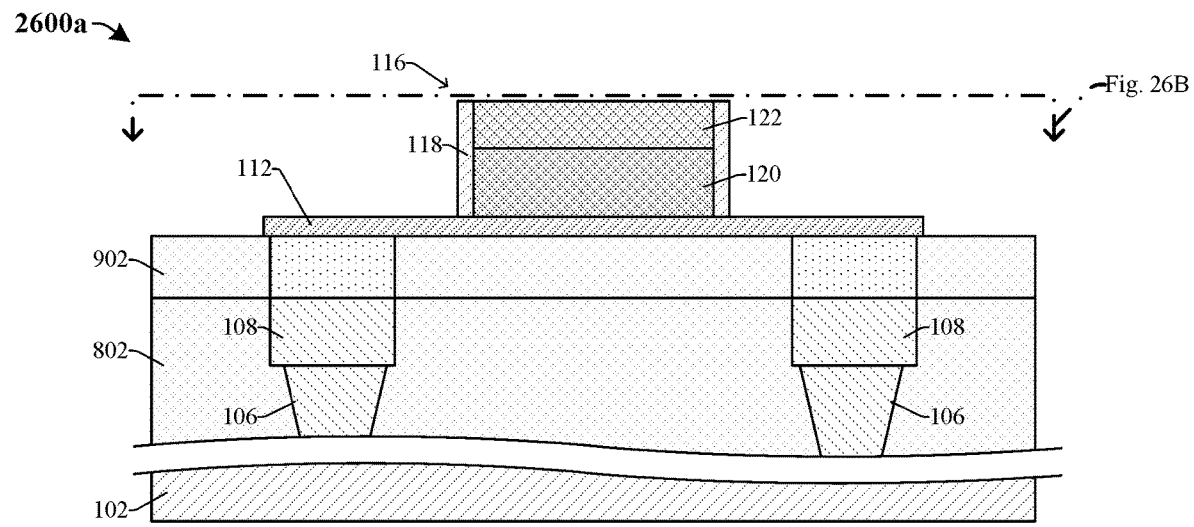
Figure 26B:
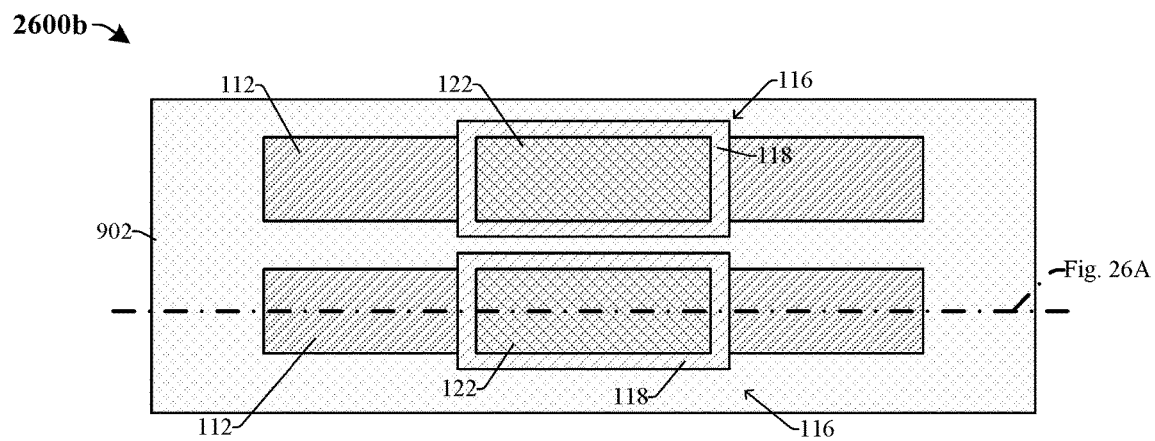

At act 2210, a sidewall spacer structure is formed around the memory cell. FIGS. 14A-B illustrate various views 1400a-b corresponding to some embodiments of act 2210. Alternatively, FIGS. 18A-B illustrate various views 1800a-b corresponding to an alternative embodiment of act 2210. Further, FIGS. 24A-B illustrate various views 2400a-b corresponding to a further embodiment of act 2210. Furthermore, FIGS. 26A-B illustrate various views 2600a-b corresponding to another further embodiment of act 2210.

At act 2212, a shunting layer is formed over an upper surface of the SOT layer. FIGS. 15A-B illustrate various views 1500a-b corresponding to some embodiments of act 2212. Alternatively, FIGS. 19A-B illustrate various views 1900a-b corresponding to an alternative embodiment of act 2212.

At act 2214, a conductive wire and a conductive via are formed over the memory cell. The conductive via overlying the memory cell directly contacts the capping structure. FIGS. 20 and 21 illustrate cross-sectional views 2000 and 2100 corresponding to some embodiments of act 2214.

FIGS. 23A-B and 24A-B illustrate various views of some embodiments of acts that may be performed in place of the acts at FIGS. 13A-C and 14A-B, such that the first embodiment of the method of FIGS. 13A-C, 14A-B, and 15A-B may alternatively proceed from FIGS. 8 to 12, FIGS. 23A-B to 24A-B, and then from FIGS. 24A-B to FIGS. 15A-B and 20-21 (i.e., skipping FIGS. 14A-B, 16A-B, 17A-B, 18A-B, and 19A-B). In such embodiments, the SOT sidewall spacer structure 1402 is omitted from FIGS. 15A-B and 20-21. As shown in cross-sectional view 2300a of FIG. 23A and top view 2300b of FIG. 23B, the MTJ structure 120 and the capping structure 122 are patterned, thereby defining a memory cell 116. Subsequently, a sidewall spacer structure 118 is formed around sidewalls of the memory cell 116. The top view 2300b of FIG. 23B corresponds to some alternative embodiments represented by the cross-sectional view 2300a of FIG. 23A taken from above the plane indicated by the dashed line in FIG. 23A. As illustrated in FIG. 23B, the sidewall spacer structure 118 laterally encloses the memory cell 116.

As shown in cross-sectional view 2400a of FIG. 24A and top view 2400b of FIG. 24B, a patterning process is performed on the SOT layer 112 such that the SOT layer 112 has a rectangular shape when viewed from above, as illustrated in the top view 2400b of FIG. 24B. In some embodiments, the SOT layer 112 may be patterned as illustrated and/or described in FIGS. 13A-C. The top view 2400b of FIG. 24B corresponds to some alternative embodiments represented by the cross-sectional view 2400a of FIG. 24A taken from above the plane indicated by the dashed line in FIG. 24A.

FIGS. 25A-B and 26A-B illustrate various views of some embodiments of acts that may be performed in place of the acts at FIGS. 16A-B through 18A-B, such that the second embodiment of the method of FIGS. 16A-B, 17A-B, 18A-B, and 19A-B may alternatively proceed from FIGS. 8 to 12, FIGS. 25A-B to 26A-B, and then from FIGS. 26A-B to FIGS. 19A-B and 20-21 (i.e., skipping FIGS. 13A-C through 18A-B). In such embodiments, the SOT sidewall spacer structure 1402 is omitted from FIGS. 19A-B and 20-21. As shown in cross-sectional view 2500a of FIG. 25A and top view 2500b of FIG. 25B, the MTJ structure 120 and the capping structure 122 are patterned, thereby defining a memory cell 116. Subsequently, a sidewall spacer structure 118 is formed around sidewalls of the memory cell 116. The top view 2500b of FIG. 25B corresponds to some alternative embodiments represented by the cross-sectional view 2500a of FIG. 25A taken from above the plane indicated by the dashed line in FIG. 25A. As illustrated in FIG. 25B, the sidewall spacer structure 118 laterally encloses the memory cell 116.

As shown in cross-sectional view 2600a of FIG. 26A and top view 2600b of FIG. 26B, a patterning process is performed on the SOT layer 112 such that the SOT layer 112 has a rectangular shape when viewed from above, as illustrated in the top view 2600b of FIG. 26B. The top view 2600b of FIG. 26B corresponds to some alternative embodiments represented by the cross-sectional view 2600a of FIG. 26A taken from above the plane indicated by the dashed line in FIG. 26A.

Accordingly, in some embodiments, the present disclosure relates to a memory device including a magnetic tunnel junction (MTJ) structure overlying a spin orbit torque (SOT) layer and a shunting layer disposed along an upper surface of the SOT layer.

In some embodiments, the present application provides a memory device including a magnetic tunnel junction (MTJ) structure overlying a semiconductor substrate, wherein the MTJ structure includes a free layer, a reference layer, and a tunnel barrier layer disposed between the free and reference layers; a bottom electrode via (BEVA) underlying the MTJ structure, wherein the BEVA is laterally offset from the MTJ structure by a lateral distance; a spin orbit torque (SOT) layer disposed vertically between the BEVA and the MTJ structure, wherein the SOT layer continuously extends along the lateral distance; and a shunting layer extending across an upper surface of the SOT layer, wherein the shunting layer extends across substantial portion(s) of the lateral distance.

In further embodiments, the present application provides a magnetoresistive random access memory (MRAM) device including a magnetic tunnel junction (MTJ) structure overlying a semiconductor substrate, wherein the MTJ structure includes a free layer, a reference layer, and a tunnel barrier layer disposed between the free and reference layers; a top electrode via (TEVA) overlying the MTJ structure, wherein the TEVA is electrically coupled to the MTJ structure; a first bottom electrode via (BEVA) underlying the MTJ structure, wherein the first BEVA is laterally offset from the MTJ structure by a first lateral distance, wherein the first lateral distance is non-zero; a spin orbit torque (SOT) layer disposed vertically between the BEVA and the MTJ structure, wherein the SOT layer continuously extends along the first lateral distance, wherein a top surface of the SOT layer directly contacts a bottom surface of the MTJ structure; and a shunting layer extending across substantial portion(s) of the top surface of the SOT layer, wherein the shunting layer is laterally offset from the outer perimeter of the MTJ structure by a non-zero distance.

In yet further embodiments, the present application provides a method for forming a memory device, the method includes forming a conductive via over a substrate; forming a bottom electrode via (BEVA) over the conductive via; forming a spin orbit torque (SOT) layer over the BEVA, wherein the SOT layer contacts an upper surface of the BEVA; forming a memory cell over the SOT layer, such that the memory cell is laterally offset from the BEVA by a lateral distance, wherein the lateral distance is non-zero; forming a sidewall spacer structure over the SOT layer, wherein the sidewall spacer structure laterally surrounds the memory cell; and forming a shunting layer over the SOT layer, such that the shunting layer extends across a substantial portion of the upper surface of the SOT layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a memory device, the method comprising:
   forming a bottom electrode via (BEVA) over a substrate;
   forming a spin orbit torque (SOT) layer over the BEVA, wherein the SOT layer contacts an upper surface of the BEVA;
   forming a memory cell over the SOT layer, such that the memory cell is laterally offset from the BEVA by a lateral distance, wherein the lateral distance is non-zero, wherein the memory cell comprises a magnetic tunnel junction (MTJ) structure and a capping structure over the MTJ structure;
   forming a sidewall spacer structure over the SOT layer, wherein the sidewall spacer structure laterally surrounds the memory cell;
   forming a shunting layer over the SOT layer, such that the shunting layer extends across portions of an upper surface of the SOT layer, wherein the shunting layer laterally wraps around an outer perimeter of the memory cell; and
   forming a conductive wire and a conductive via over the memory cell, wherein the conductive via directly contacts the capping structure.

2. The method of claim 1, wherein forming the memory cell comprises:
   depositing the MJT structure and the capping structure over the SOT layer;
   performing a first patterning process on the MTJ structure and the capping structure, such that the first patterning process stops after reaching the upper surface of the SOT layer; and
   performing a second patterning process on the MTJ structure and the capping structure, thereby defining the memory cell, wherein the second patterning process etches through at least a portion of the SOT layer.

3. The method of claim 1, wherein forming the sidewall spacer structure comprises:
   depositing a dielectric material over the memory cell and the SOT layer; and
   performing an etching process on the dielectric material, such that the dielectric material is removed from horizontal surfaces of the memory cell and the SOT layer, thereby defining the sidewall spacer structure, wherein the etching process comprises performing an anisotropic etch process.

4. The method of claim 1, wherein forming the memory cell comprises:
   depositing the MJT structure and the capping structure over the SOT layer; and
   performing a patterning process on the MTJ structure and the capping structure, such that the patterning process stops after reaching the upper surface of the SOT layer, thereby defining the memory cell.

5. A memory device comprising:
   a magnetic tunnel junction (MTJ) structure overlying a semiconductor substrate, wherein the MTJ structure comprises a free layer, a reference layer, and a tunnel barrier layer disposed between the free and reference layers;

a bottom electrode via (BEVA) underlying the MTJ structure, wherein the BEVA is laterally offset from the MTJ structure by a lateral distance;

a spin orbit torque (SOT) layer disposed vertically between the BEVA and the MTJ structure, wherein the SOT layer continuously extends along the lateral distance between the BEVA and the MTJ structure, wherein a bottom surface of the SOT layer directly contacts a top surface of the BEVA; and a shunting layer extending across an upper surface of the SOT layer, wherein the shunting layer extends across at least a portion of the lateral distance, wherein the shunting layer directly overlies the top surface of the BEVA.

6. The memory device of claim 5, wherein the upper surface of the SOT layer directly contacts and continuously extends along a bottom surface of the MTJ structure, wherein the shunting layer is laterally offset from the bottom surface of the MTJ structure in a direction away from the MTJ structure.

7. The memory device of claim 5, wherein the shunting layer comprises a first material and the SOT layer comprises a second material different from the first material.

8. The memory device of claim 5, wherein a thickness of the shunting layer is greater than a thickness of the SOT layer.

9. The memory device of claim 5, wherein a sheet resistance of the shunting layer is less than a sheet resistance of the SOT layer.

10. The memory device of claim 5, wherein the shunting layer comprises a nonmagnetic metallic material.

11. The memory device of claim 5, further comprising:
a sidewall spacer structure disposed laterally around the MTJ structure, wherein the sidewall spacer structure is disposed laterally between the MTJ structure and the shunting layer.

12. The memory device of claim 11, wherein the shunting layer continuously laterally extends from a sidewall of the BEVA to a sidewall of the sidewall spacer structure.

13. The memory device of claim 5, wherein a bottom surface of the shunting layer is aligned with a bottom surface of the MTJ structure.

14. The memory device of claim 13, wherein an upper surface of the shunting layer is disposed above an upper surface of the tunnel barrier layer.

15. A magnetoresistive random access memory (MRAM) device comprising:
a magnetic tunnel junction (MTJ) structure overlying a semiconductor substrate, wherein the MTJ structure comprises a free layer, a reference layer, and a tunnel barrier layer disposed between the free and reference layers;

a top electrode via (TEVA) overlying the MTJ structure, wherein the TEVA is electrically coupled to the MTJ structure;

a first bottom electrode via (BEVA) underlying the MTJ structure, wherein the first BEVA is laterally offset from the MTJ structure by a first lateral distance, wherein the first lateral distance is non-zero;

a spin orbit torque (SOT) layer disposed vertically between the BEVA and the MTJ structure, wherein the SOT layer continuously extends along the first lateral distance, wherein a top surface of the SOT layer directly contacts a bottom surface of the MTJ structure; and a shunting layer extending across a substantial portion of the top surface of the SOT layer, wherein the shunting layer is laterally offset from an outer perimeter of the MTJ structure by a non-zero distance, wherein a bottom surface of the shunting layer is aligned with the bottom surface of the MTJ structure.

16. The MRAM device of claim 15, further comprising:
a second BEVA underlying the MTJ structure, wherein the second BEVA is laterally offset from the MTJ structure by a second lateral distance, wherein the second lateral distance is non-zero; and wherein the first BEVA is disposed along a first side of the SOT layer opposite a second side of the SOT layer, wherein the second BEVA is disposed along the second side of the SOT layer.

17. The MRAM device of claim 15, wherein the bottom surface of the shunting layer directly overlies a top surface of the TEVA, and a width of the bottom surface of the shunting layer is greater than a width of the top surface of the TEVA.

18. The MRAM device of claim 15, wherein a thickness of the SOT layer is less than twice the thickness of the shunting layer.

19. The MRAM device of claim 15, further comprising:
a sidewall spacer structure disposed between the shunting layer and a sidewall of the MTJ structure, wherein the sidewall spacer structure continuously extends from the sidewall of the MTJ structure to the top surface of the SOT layer.

20. The MRAM device of claim 19, wherein the sidewall spacer structure directly contacts a sidewall of the shunting layer.

* * * * *